(12) United States Patent
Weng et al.

(10) Patent No.: US 12,022,616 B2
(45) Date of Patent: Jun. 25, 2024

(54) RADIO FREQUENCY FRONT-END MODULE, MANUFACTURING METHOD THEREOF AND COMMUNICATION DEVICE

(71) Applicant: Shenzhen Newsonic Technologies Co., Ltd., Guangdong (CN)

(72) Inventors: Guojun Weng, Guangdong (CN); Xiaolong Wang, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/200,230

(22) Filed: May 22, 2023

(65) Prior Publication Data
US 2023/0292438 A1 Sep. 14, 2023

Related U.S. Application Data

(63) Continuation of application No. PCT/CN2022/122695, filed on Sep. 29, 2022.

(30) Foreign Application Priority Data

Aug. 17, 2022 (CN) .......................... 202210985933.5

(51) Int. Cl.
*H05K 1/14* (2006.01)
*H01L 21/56* (2006.01)
(Continued)

(52) U.S. Cl.
CPC ........... *H05K 1/144* (2013.01); *H01L 21/568* (2013.01); *H01L 23/5384* (2013.01);
(Continued)

(58) Field of Classification Search
CPC ..... H01L 21/568; H01L 23/5384; H05K 1/44; H05K 1/144
See application file for complete search history.

(56) References Cited

U.S. PATENT DOCUMENTS

| 6,297,551 | B1 | 10/2001 | Dudderar et al. |
| 2014/0175622 | A1* | 6/2014 | Chen ....................... H01L 21/56 257/659 |
| 2018/0240757 | A1 | 8/2018 | Wong et al. |

FOREIGN PATENT DOCUMENTS

| CN | 108701681 A | 10/2018 |
| CN | 115064450 A | 9/2022 |

* cited by examiner

Primary Examiner — Errol V Fernandes
(74) Attorney, Agent, or Firm — Leason Ellis LLP

(57) ABSTRACT

A radio frequency front-end module, a manufacturing method thereof and a communication device are provided. The radio frequency front-end module includes a first base substrate and a metal bonding structure; a second functional substrate, including a second base substrate, a groove in the second base substrate, and a bonding metal layer; and a first radio frequency front-end component, at least partially located in the groove, the first base substrate and the second base substrate are oppositely arranged, and a surface of the second base substrate close to the first base substrate includes a groove surface inside the groove and a substrate surface outside the groove, and the bonding metal layer includes a first metal portion located on the groove surface and a second metal portion located on the substrate surface, the first radio frequency front-end component is at least partially surrounded by the first metal portion.

10 Claims, 17 Drawing Sheets

(51) Int. Cl.
  *H01L 23/00*      (2006.01)
  *H01L 23/538*     (2006.01)
  *H01L 25/00*      (2006.01)
  *H01L 25/065*     (2023.01)
  *H05K 1/11*       (2006.01)
  *H05K 3/34*       (2006.01)
  *H05K 3/40*       (2006.01)
(52) U.S. Cl.
  CPC .......... *H01L 24/16* (2013.01); *H01L 25/0655* (2013.01); *H01L 25/50* (2013.01); *H05K 1/115* (2013.01); *H05K 3/34* (2013.01); *H05K 3/4038* (2013.01); *H01L 2224/16227* (2013.01); *H01L 2224/16238* (2013.01); *H05K 2201/042* (2013.01); *H05K 2201/09036* (2013.01); *H05K 2201/09509* (2013.01); *H05K 2201/10098* (2013.01); *H05K 2201/10674* (2013.01); *H05K 2201/10984* (2013.01)

RADIO FREQUENCY FRONT-END MODULE, MANUFACTURING METHOD THEREOF AND COMMUNICATION DEVICE

CROSS-REFERENCE TO RELATED APPLICATIONS

The present application is a continuation of international application No. PCT/CN2022/122695 filed on Sep. 29, 2022, which claims the priority of Chinese Patent Application No. 202210985933.5 filed on Aug. 17, 2022, and the disclosures of all these applications are incorporated herein as a part of this application.

TECHNICAL FIELD

The embodiments of the present disclosure relate to a radio frequency front-end module, a manufacturing method of the radio frequency front-end module, and a communication device.

BACKGROUND

Radio frequency front-end (RFFE) is the core component to achieve the communication functions of a mobile phone and various mobile terminals. The radio frequency front-end mainly includes a power amplifier (PA), a radio frequency switch (Switch), a low noise amplifier (LNA) and a filter (Filter).

Radio frequency front-end module integrates two or more components, such as the radio frequency switch, the low noise amplifier, the filter and the power amplifier, into one module, so as to improve the integration and performance, and make the volume smaller. On the other hand, with the continuous development of 5G technology, the application and demand for radio frequency front-end modules are constantly upgrading, and the market demands higher and higher cost performance of the radio frequency front-end module.

SUMMARY

Embodiments of the present disclosure provide a radio frequency front-end module, a manufacturing method thereof and a communication device. In the radio frequency front-end module provided by the embodiments of the present disclosure, because the first base substrate and the second base substrate are oppositely arranged, a cavity can be formed between the first base substrate and the groove, thus providing a cavity structure for the first radio frequency front-end components such as filter, so that the radio frequency front-end module does not need to package the first radio frequency front-end component at wafer level, and the cavity required by the first radio frequency front-end component can be formed by the groove in the second base substrate, thereby reducing the manufacturing cost of the radio frequency front-end module. In addition, the first radio frequency front-end module is at least partially surrounded by the first metal portion, and the second metal portion is bonded with the metal bonding structure, so that the radio frequency front-end module can not only achieve the bonding function, but also achieve the electromagnetic interference shielding function of the first radio frequency front-end module through the bonding metal layer, and extra shielding structure is omitted, thereby reducing the packaging cost of the radio frequency front-end module. On the other hand, because the radio frequency front-end module omits the related structure of wafer-level package and the shielding structure, the structure of the radio frequency front-end module is relatively simple and the product size is small.

At least one embodiment of the present disclosure provides a radio frequency front-end module, which includes: a first functional substrate, including a first base substrate and a metal bonding structure; a second functional substrate, including a second base substrate, a groove in the second base substrate, and a bonding metal layer; and a first radio frequency front-end component, at least partially located in the groove, the first base substrate and the second base substrate are oppositely arranged, and a surface of the second base substrate close to the first base substrate includes a groove surface inside the groove and a substrate surface outside the groove, the first radio frequency front-end component is not in contact with the bonding metal layer, and the bonding metal layer includes a first metal portion located on the groove surface and a second metal portion located on the substrate surface, the first radio frequency front-end component is at least partially surrounded by the first metal portion, and the second metal portion is bonded with the metal bonding structure.

For example, in the radio frequency front-end module according to an embodiment of the present disclosure, the first metal portion and the second metal portion of the bonding metal layer are integrally formed, and the groove surface includes a first surface located at a bottom of the groove and a second surface located at a sidewall of the groove, and the first metal portion is continuously arranged on the first surface and the second surface.

For example, in the radio frequency front-end module according to an embodiment of the present disclosure, the first functional substrate further includes a substrate through hole penetrating the first base substrate and a first conductive structure located in the substrate through hole, the first radio frequency front-end component is electrically connected with one end of the first conductive structure, and the first radio frequency front-end component is spaced from the bonding metal layer.

For example, in the radio frequency front-end module according to an embodiment of the present disclosure, the first functional substrate further includes: a flip-chip pad, connected with the first conductive structure, the first radio frequency front-end component is soldered on the flip-chip pad, and the flip-chip pad is arranged in the same layer as the metal bonding structure.

For example, in the radio frequency front-end module according to an embodiment of the present disclosure, the radio frequency front-end module includes a plurality of first radio frequency front-end components, and the second base substrate includes a plurality of grooves; the plurality of first radio frequency front-end components and the plurality of grooves are arranged in one-to-one correspondence, and each of the plurality of first radio frequency front-end components is at least partially located in a corresponding one of the plurality of grooves.

For example, in the radio frequency front-end module according to an embodiment of the present disclosure, the first radio frequency front-end module includes at least one selected from the group consisting of a filter die, a radio frequency switch chip, a radio frequency switch die, a low noise amplifier chip, a low noise amplifier die, a radio frequency power amplifier chip, a radio frequency power amplifier die, an inductor and a capacitor.

For example, the radio frequency front-end module according to an embodiment of the present disclosure further includes: an electrical interconnection structure, located at a side of the first functional substrate away from the second functional substrate; and an array pad, located at a side of the electrical interconnection structure away from the first functional substrate.

For example, the radio frequency front-end module according to an embodiment of the present disclosure further includes: an electrical interconnection structure, located at a side of the first functional substrate away from the second functional substrate; a first pad, located at a side of the electrical interconnection structure away from the first functional substrate; and a second radio frequency front-end component, connected with the first pad.

For example, the radio frequency front-end module according to an embodiment of the present disclosure further includes: a second pad, located at a side of the electrical interconnection structure away from the first functional substrate; an encapsulation layer, located at a side of the second radio frequency front-end component away from the first functional substrate and wraps the second radio frequency front-end component; a second conductive structure; and an array pad, located at a side of the encapsulation layer away from the second radio frequency front-end component, the encapsulation layer includes an encapsulation layer through hole, the second conductive structure is located in the encapsulation layer through hole, one end of the second conductive structure is connected with the second pad, and the other end of the second conductive structure is electrically connected with the array pad.

For example, the radio frequency front-end module according to an embodiment of the present disclosure further includes: a plastic molding structure, the plastic molding structure wraps a surface of the second functional substrate away from the first functional substrate, a lateral surface of the second functional substrate and a lateral surface of the first functional substrate.

For example, the radio frequency front-end module according to an embodiment of the present disclosure further includes: a plastic molding structure, the plastic molding structure wraps a surface of the second functional substrate away from the first functional substrate, a surface of the first functional substrate away from the second functional substrate, a lateral surface of the second functional substrate, and a lateral surface of the first functional substrate.

For example, the radio frequency front-end module according to an embodiment of the present disclosure further includes: an electrical interconnection structure, located at a side of the first functional substrate away from the second functional substrate; a metal pad, located at a side of the electrical interconnection structure away from the first functional substrate; a conductive support column, located at a side of the metal pad away from the electrical interconnection structure; a passivation layer, located at a side of the conductive support column away from the first functional substrate; and an array pad, located at a side of the passivation layer away from the plastic molding structure, the plastic molding structure further includes an upper molding portion located on the first functional substrate away from the second functional substrate, the upper molding portion includes a first through hole, the conductive support column is located in the first through hole, the passivation layer includes a second through hole, and the array pad is connected with the metal pad through the second through hole and the conductive support column located in the first through hole.

For example, in the radio frequency front-end module according to an embodiment of the present disclosure, materials of the first base substrate and the second base substrate include high-resistance silicon or glass.

At least one embodiment of the present disclosure further includes a communication device, which includes the above-mentioned radio frequency front-end module according to any one of the above embodiments.

At least one embodiment of the present disclosure further provides a manufacturing method of a radio frequency front-end module, including: dividing at least one first radio frequency front-end region on a first base substrate; forming a metal bonding structure in each of the at least one first radio frequency front-end region; installing a first radio frequency front-end component in each of the at least one first radio frequency front-end region; dividing at least one second radio frequency front-end region on a second base substrate; forming a groove in each of the at least one second radio frequency front-end region, and forming a bonding metal layer at a side of the second base substrate where the groove is formed; and arranging the first base substrate and the second base substrate oppositely, and bonding the metal bonding structure in the first radio frequency front-end region and the bonding metal layer in the second radio frequency front-end region to form a radio frequency front-end unit, in each of the at least one second radio frequency front-end region, a surface of the second base substrate close to the first base substrate includes a groove surface located inside the groove and a substrate surface located outside the groove, in each of the at least one second radio frequency front-end region, the bonding metal layer includes a first metal portion located on the groove surface and a second metal portion located on the substrate surface, the first radio frequency front-end component is at least partially surrounded by the first metal portion, and the second metal portion is bonded with the metal bonding structure.

For example, the manufacturing method of the radio frequency front-end module according to an embodiment of the present disclosure further includes: forming a substrate blind hole in each of the at least one first radio frequency front-end region of the first base substrate; filling the substrate blind hole with a conductive material to form a first conductive structure located in the substrate blind hole; and forming a flip chip pad connected with the first conductive structure on the first conductive structure.

For example, in the manufacturing method of the radio frequency front-end module according to an embodiment of the present disclosure, installing the first radio frequency front-end module in each of the at least one first radio frequency front-end region includes: acquiring a wafer including a first radio frequency front-end component; cutting the wafer to obtain the first radio frequency front-end component; and soldering the first radio frequency front-end component on the flip-chip pad.

For example, in the manufacturing method of the radio frequency front-end module according to an embodiment of the present disclosure, after bonding the metal bonding structure in the first radio frequency front-end region and the bonding metal layer in the second radio frequency front-end region, the first base substrate is thinned to expose the substrate blind hole in each of the at least one first radio frequency front-end region to form a substrate through hole.

For example, the manufacturing method of the radio frequency front-end module according to an embodiment of the present disclosure further includes: forming an electrical interconnection structure at a side of the first base substrate away from the second base substrate; forming an array pad at a side of the electrical interconnection structure away from the first base substrate; and thinning the second base substrate, the electrical interconnection structure is connected with the first conductive structure.

For example, in the manufacturing method of the radio frequency front-end module according to an embodiment of the present disclosure, the at least one first radio frequency front-end region includes a plurality of first radio frequency front-end regions, and the at least one second radio frequency front-end region includes a plurality of second radio frequency front-end regions, and the first radio frequency front-end regions and the second radio frequency front-end regions are arranged in one-to-one correspondence, and the manufacturing method further includes: cutting the first base substrate and the second base substrate to separate a plurality of radio frequency front-end units.

For example, the manufacturing method of the radio frequency front-end module according to an embodiment of the present disclosure further including: rearranging the plurality of radio frequency front-end units on a temporary carrier plate through temporary adhesive, wherein the second base substrate of each of the plurality of radio frequency front-end units is located at a side of the first base substrate away from the temporary carrier plate; coating a plastic material at a side of the plurality of radio frequency front-end units and the temporary carrier plate to wrap each of the plurality of radio frequency front-end units; removing the temporary carrier plate and the temporary adhesive; and cutting the plastic material to separate the plurality of radio frequency front-end units including the plastic material.

For example, the manufacturing method of the radio frequency front-end module according to an embodiment of the present disclosure further includes: forming a metal pad on a surface of the electrical interconnection structure away from the first base substrate; forming a conductive support column at a side of the metal pad away from the first base substrate; and thinning the second base substrate.

For example, in the manufacturing method of the radio frequency front-end module according to an embodiment of the present disclosure, the at least one first radio frequency front-end region includes a plurality of first radio frequency front-end regions, and the at least one second radio frequency front-end region includes a plurality of second radio frequency front-end regions, and the plurality of first radio frequency front-end regions and the plurality of second radio frequency front-end regions are arranged in one-to-one correspondence, and the manufacturing method further includes: cutting the first base substrate and the second base substrate to separate a plurality of radio frequency front-end units.

For example, the manufacturing method of the radio frequency front-end module according to an embodiment of the present disclosure further includes: rearranging a plurality of radio frequency front-end units on a temporary carrier plate through temporary adhesive, wherein the conductive support column of each of the plurality of radio frequency front-end units is located at a side of the first base substrate close to the temporary carrier plate; coating a plastic material at a side of the plurality of radio frequency front-end units and the temporary carrier plate to wrap each of the plurality of radio frequency front-end units, and the plastic material further wraps the conductive support column to form an upper molding portion; removing the temporary carrier plate and the temporary adhesive; forming a passivation layer at a side of the upper molding portion away from the first base substrate; forming a through hole in the passivation layer; forming an array pad at a side of the passivation layer away from the upper molding portion; and cutting the plastic material and the passivation layer to separate the plurality of radio frequency front-end units including the plastic material.

For example, the manufacturing method of the radio frequency front-end module according to an embodiment of the present disclosure further includes: forming an electrical interconnection structure at a side of the first base substrate away from the second base substrate; forming a first pad and a second pad at a side of the electrical interconnection structure away from the first base substrate; soldering a second radio frequency front-end component on the first pad; forming a second conductive structure on the second pad; forming an encapsulation layer at a side of the second radio frequency front-end component away from the first base substrate; and forming an array pad at a side of the encapsulation layer away from the second radio frequency front-end component, one end of the second conductive structure is connected with the second pad, and the other end of the second conductive structure is electrically connected with the array pad.

At least one embodiment of the present disclosure further provides a packaging method for a radio frequency front-end module, which includes: forming a plurality of second grooves on a preset cover plate to be packaged; setting a first metal layer at a side of the cover plate to be packaged with the plurality of second grooves to form a cover body to be bonded; bonding a preset radio frequency front-end module to be bonded with the cover body to be bonded to obtain a first radio frequency module package structure.

For example, in the packaging method for the radio frequency front-end module according to an embodiment of the present disclosure, after the preset radio frequency front-end module to be bonded and the cover body to be bonded are bonded, the method further includes: forming a first metal pad which is electrically interconnected with the radio frequency front-end module to be bonded at a side of the radio frequency front-end module to be bonded away from the cover body to be bonded, and obtaining a second radio frequency module package structure.

For example, in the packaging method for the radio frequency front-end module according to an embodiment of the present disclosure, the radio frequency front-end module to be bonded is provided with a plurality of first metal columns; forming the first metal pad electrically interconnected with the radio frequency front-end module to be bonded at a side of the radio frequency front-end module to be bonded away from the cover body to be bonded, including thinning a side of the radio frequency front-end module to be bonded away from the cover plate to be packaged to expose each of the plurality of first metal columns; arranging an electrical interconnection layer at a side of the radio frequency front-end module to be bonded, where the first metal columns are exposed; forming a first metal pad electrically interconnected with each of the plurality of first metal columns at a side of the electrical interconnection layer away from the radio frequency front-end module to be bonded.

For example, in the packaging method for the radio frequency front-end module according to an embodiment of the present disclosure, a second metal pad and a third metal pad are provided at a side of the electrical interconnection layer away from the radio frequency front-end module to be bonded; forming the first metal pad electrically interconnected with each of the plurality of first metal columns at a side of the electrical interconnection layer away from the radio frequency front-end module to be bonded includes: forming a second metal column on the second metal pad; electrically connecting a radio frequency module component on the third metal pad; plastic molding a side of the electrical interconnection layer away from the radio frequency front-end module to be bonded to form a plastic molding structure; thinning the plastic molding structure to expose the second metal column; forming the first metal pad connected with the second metal column.

For example, in the packaging method for the radio frequency front-end module according to an embodiment of the present disclosure, forming the first metal pad connected with the second metal column includes: forming a passivation layer at a side of the plastic molding structure where the second metal columns are exposed; etching the passivation layer to expose the second metal column; and forming the first metal pad connected with the second metal column on the passivation layer.

For example, in the packaging method for the radio frequency front-end module according to an embodiment of the present disclosure, after obtaining the second radio frequency module package structure, the method further includes: thinning a side of the cover body to be bonded away from the second groove to obtain a first package structure to be processed; cutting the first package structure to be processed into first filter pieces; rearranging the first filter pieces to obtain a second package structure to be processed; plastic packaging the second package structure to be processed to obtain a third package structure to be processed; cutting the third package structure to be processed into second filter pieces.

At least one embodiment of the present disclosure further provides a radio frequency front-end module package structure, which is made by executing any of the above-mentioned packaging methods for radio frequency front-end modules.

For example, in the radio frequency front-end module package structure according to an embodiment of the present disclosure, it includes: an radio frequency front-end module to be bonded, which includes an interposer, a second metal layer, a first metal column, a fourth metal pad, and an radio frequency front-end component; the interposer is provided with the second metal layer and a plurality of first grooves, each of the first grooves is filled with the first metal column, the first metal column is connected with the fourth metal pad, the fourth metal pad is connected with a radio frequency front-end component, and the second metal layer is not in contact with the fourth metal pad; a cover body to be bonded, which includes a cover plate to be packaged and a first metal layer; the cover plate to be packaged is provided with a plurality of second grooves, and a side of the cover plate to be packaged with the second grooves is provided with a first metal layer; the first metal layer is connected with the second metal layer; the radio frequency front-end component is arranged in the second groove; the radio frequency front-end component, the first metal layer on the second groove corresponding to the radio frequency front-end component, the second metal layer and the interposer are together enclosed to form a cavity.

For example, in the radio frequency front-end module package structure according to an embodiment of the present disclosure, it further includes: an electrical interconnection layer provided with a second metal pad; the electrical interconnection layer is arranged at a side of the radio frequency front-end module to be bonded away from the cover body to be bonded; the first metal pad is electrically interconnected with the first metal column through the second metal pad.

For example, in the radio frequency front-end module package structure according to an embodiment of the present disclosure, the electrical interconnection layer is further provided with a third metal pad, and the radio frequency module package structure further includes a radio frequency module component, which is soldered to the electrical interconnection layer through the third metal pad.

BRIEF DESCRIPTION OF DRAWINGS

In order to more clearly explain the technical solution of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

Figure 1:
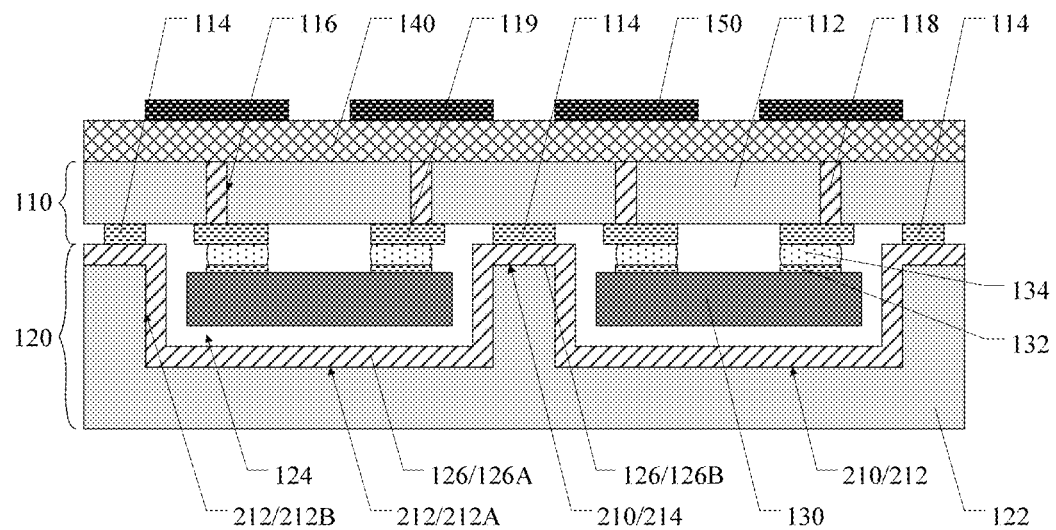
FIG. 1 is a structural diagram of a radio frequency front-end module according to an embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, the technical terms or scientific terms used in this disclosure shall have their ordinary meanings as understood by those with ordinary skills in the field to which this disclosure belongs. The words "first", "second" and the like used in this disclosure do not indicate any order, quantity or importance, but are only used to distinguish different components. Words such as "comprising" or "including" refer to that the elements or objects appearing before the word cover the listed elements or objects appearing after the word and their equivalents, without excluding other elements or objects. The phrases "connect", "connected", etc., are not intended to define a physical connection or a mechanical connection, but may include an electrical connection which is direct or indirect.

Unless otherwise defined, the features such as "parallel", "vertical" and "identical" used in the embodiments of the present disclosure all include cases such as parallel, vertical and identical in the strict sense, and cases such as approximately parallel, approximately vertical and approximately identical with certain errors. For example, the above-mentioned "substantially" can mean that the difference of the compared objects is within 10% or 5% of the average value of the compared objects. In the case that the number of a component or element is not specifically indicated hereinafter in the embodiment of the present disclosure, it refers to that the component or element can be one or more, or can be understood as at least one. "At least one" refers to one or more, and "a plurality of" refers to at least two. The "arranged in the same layer" in the disclosed embodiment refers to the relationship between a plurality of film layers formed by the same material after the same step (for example, one-step patterning process). The "same layer" here does not always refer to that the thickness of multiple film layers is the same or the height of multiple film layers in the cross-sectional view is the same.

In the research, the inventor(s) of this application noticed that in the packaging process of a radio frequency front-end module, the filter wafer is usually subjected to wafer-level package (WLP) to form a cavity structure required by the filter, then the wafer is cut to obtain a single filter, and then the single filter is packaged on a PCB (Printed circuit board) substrate, and finally the radio frequency front-end module is obtained. However, the manufacturing cost of radio frequency front-end module is high because of the expensive materials and complicated process of wafer level package (WLP). On the other hand, for some radio frequency front-end module products, some filters or amplifiers need to be shielded from electromagnetic interference. Therefore, an additional shielding component need to be added in the packaging process of radio frequency front-end module to shield the components, which need electromagnetic shielding, from electromagnetic interference, which increases the packaging complexity and cost of radio frequency front-end module.

Therefore, the embodiment of the present disclosure provides a radio frequency front-end module, a manufacturing method thereof and a communication device. The radio frequency front-end module includes a first functional substrate, a second functional substrate and a first radio frequency front-end component. The first functional substrate includes a first base substrate and a metal bonding structure; the second functional substrate includes a second base substrate, a groove in the second base substrate, and a bonding metal layer; the first radio frequency front-end component is at least partially located in the groove; the first base substrate and the second base substrate are oppositely arranged, and a surface of the second base substrate close to the first base substrate includes a groove surface located inside the groove and a substrate surface located outside the groove; the bonding metal layer includes a first metal portion on the groove surface and a second metal portion on the substrate surface; the first radio frequency front-end component is at least partially surrounded by the first metal portion, and the second metal portion is bonded with the metal bonding structure. Therefore, the radio frequency front-end module has the following beneficial effects: (1) the radio frequency front-end module does not need to package the first radio frequency front-end module at wafer level, and the cavity required by the first radio frequency front-end module can be formed by the groove in the second base substrate, thereby reducing the manufacturing cost of the radio frequency front-end module; (2) the radio frequency front-end module can not only achieve the bonding function, but also the electromagnetic interference shielding function of the first radio frequency front-end module through the bonding metal layer, and the extra shielding structure is omitted, thereby reducing the packaging cost of the radio frequency front-end module; (3) the structure of the radio frequency front-end module is relatively simple, and the product size is small.

Hereinafter, the radio frequency front-end module, the manufacturing method thereof and the communication device provided by the embodiments of the present disclosure will be described in detail with reference to the accompanying drawings.

An embodiment of the present disclosure provides a radio frequency front-end module. FIG. 1 is a structural diagram of a radio frequency front-end module according to an embodiment of the present disclosure.

As illustrated by FIG. 1, the radio frequency front-end module 100 includes a first functional substrate 110, a second functional substrate 120 and a first radio frequency front-end component 130. The first functional substrate 110 includes a first base substrate 112 and a metal bonding structure 114; the second functional substrate 120 includes a second base substrate 122, a groove 124 in the second base substrate 122, and a bonding metal layer 126. The first radio frequency front-end component 130 is at least partially located in the groove 124; the first base substrate 112 and the second base substrate 122 are oppositely arranged, so that a cavity is formed between the first base substrate 112 and the groove 124, which can be a cavity structure required by the first radio frequency front-end component such as a filter.

As illustrated by FIG. 1, a surface 210 of the second base substrate 122 close to the first base substrate 112 includes a groove surface 212 inside the groove 124 and a substrate surface 214 outside the groove 124. The first radio frequency front-end component 130 is not in contact with the bonding metal layer 126, and the bonding metal layer 126 includes a first metal portion 126A located on the groove surface 212 and a second metal portion 126B located on the substrate surface 214. The first radio frequency front-end component 130 is at least partially surrounded by the first metal portion 126A, and the second metal portion 126B is bonded with the metal bonding structure 114 to combine the first functional substrate 110 and the second functional substrate 120 and seal the cavity.

In the radio frequency front-end module provided by the embodiment of the present disclosure, because the first base substrate and the second base substrate are oppositely arranged, a cavity can be formed between the first base substrate and the groove, thus providing a cavity structure for the first radio frequency front-end component such as a filter, so the radio frequency front-end module does not need to package the first radio frequency front-end component at wafer level, and the cavity required by the first radio frequency front-end component can be formed by the groove in the second base substrate, thereby reducing the manufacturing cost of the radio frequency front-end module. In addition, the first radio frequency front-end module is at least partially surrounded by the first metal portion, and the second metal portion is bonded with the metal bonding structure, so the radio frequency front-end module can not only achieve the bonding function, but also achieve the electromagnetic interference shielding function of the first radio frequency front-end module through the bonding metal layer, and the extra shielding structure is omitted, thereby reducing the packaging cost of the radio frequency front-end module. On the other hand, because the radio frequency front-end module omits the related structure and shielding structure of wafer-level package, the structure of the radio frequency front-end module is relatively simple and the product size is small.

In some examples, the materials of the first base substrate and the second base substrate may be high-resistance silicon or glass. Therefore, the radio frequency front-end module has lower cost.

In some examples, as illustrated by FIG. 1, the first metal portion 126A and the second metal portion 126B of the bonding metal layer 126 are integrally formed. For example, the bonding metal layer may be formed by a deposition process.

In some examples, as illustrated by FIG. 1, the groove surface 212 includes a first surface 212A located at the bottom of the groove 124 and a second surface 212B located at a sidewall of the groove 124, and the first metal portion 126A is continuously disposed on the first surface 212A and the second surface 212B.

In some examples, as illustrated by FIG. 1, the first functional substrate 110 further includes a substrate through hole 116 penetrating the first base substrate 110 and a first conductive structure 118 located in the substrate through hole 116. The first radio frequency front-end component 130 is electrically connected to one end of the first conductive structure 118, and the first radio frequency front-end component 130 is spaced from the bonding metal layer 126.

In the radio frequency front-end module provided in this example, the first radio frequency front-end component is fixed on the first functional substrate and spaced from the bonding metal layer. In addition, the first radio frequency front-end component can also be electrically connected to the outside through the first conductive structure in the substrate through hole 116, so as to input and output signals.

In some examples, as illustrated by FIG. 1, the first functional substrate 110 further includes a flip-chip pad 119 connected to the first conductive structure 118. The first radio frequency front-end component 130 is soldered on the flip-chip pad 119.

In some examples, as illustrated by FIG. 1, the first radio frequency front-end component 130 includes a bonding pad 132. In this case, the first radio frequency front-end component 130 can be soldered on the flip-chip pad 119 by a tin solder ball 134. Of course, the embodiments of the present disclosure include but are not limited thereto, and the first radio frequency front-end component can also be connected to the flip-chip pad through gold bumps.

In some examples, as illustrated by FIG. 1, the radio frequency front-end module 100 includes a plurality of first radio frequency front-end components 130, and the second base substrate 120 includes a plurality of grooves 124; the plurality of first radio frequency front-end components 130 and the plurality of grooves 124 are arranged in one-to-one correspondence, and each of the plurality of first radio frequency front-end components 130 is at least partially located in a corresponding one of the plurality of grooves 124. Therefore, the radio frequency front-end module can integrate a plurality of first radio frequency front-end components together, thereby improving the integration level and performance, and miniaturizing the volume.

In some examples, the radio frequency front-end module may include a filter die because there is no need to package the filter at wafer level.

In some examples, the first radio frequency front-end component may further include at least one selected from the group consisting of radio frequency switch chip, radio frequency switch die, low noise amplifier chip, low noise amplifier die, radio frequency power amplifier chip, radio frequency power amplifier die, inductor and capacitor.

In some examples, as illustrated by FIG. 1, the radio frequency front-end module 100 further includes an electrical interconnection structure 140 and an array pad 150. The electrical interconnection structure 140 is located at a side of the first functional substrate 110 away from the second functional substrate 120; the array pad 150 is located at a side of the electrical interconnection structure 140 away from the first functional substrate 110.

In the radio frequency front-end module provided in this example, the plurality of first radio frequency front-end components 130 of the radio frequency front-end module 100 can be connected to each other through the above-mentioned electrical interconnection structure 140, thereby achieving richer functions. Therefore, the radio frequency front-end module does not need a printed circuit board (PCB), which can further reduce the packaging cost and size. On the other hand, the array pad 150 of the radio frequency front-end module 100 can be connected with external circuits or devices.

For example, the array pad can be a land grid array (LGA) pad.

Figure 2:
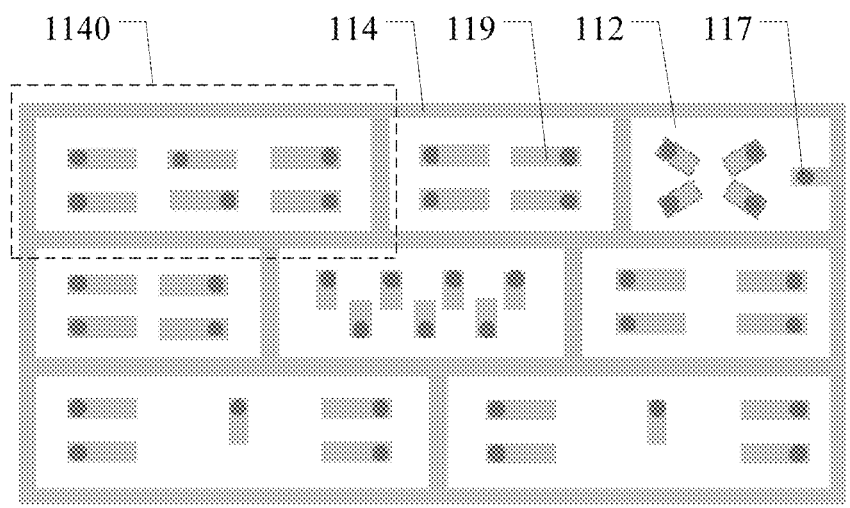
FIG. 2 is a schematic plan view of a radio frequency front-end module according to an embodiment of the present disclosure.

FIG. 2 is a schematic plan view of a radio frequency front-end module according to an embodiment of the present disclosure. As illustrated by FIG. 2, the shape of the orthographic projection of the metal bonding structure 114 on the first base substrate 112 includes a ring shape, for example, the outer contour of the metal bonding structure 114 is a ring shape, such as a rectangular ring.

In some examples, as illustrated by FIG. 2, the metal bonding structure 114 may include a plurality of ring structures 1140, and the above-mentioned first radio frequency front-end component 130 and the flip-chip pad 119 connected to the first radio frequency front-end component 130 may be disposed in the area enclosed by each ring structure 1140.

In some examples, as illustrated by FIG. 2, the radio frequency front-end module 100 further includes a ground terminal through hole 117, and the ground terminal through hole 117 can be connected with the metal bonding structure 114.

Figure 3:
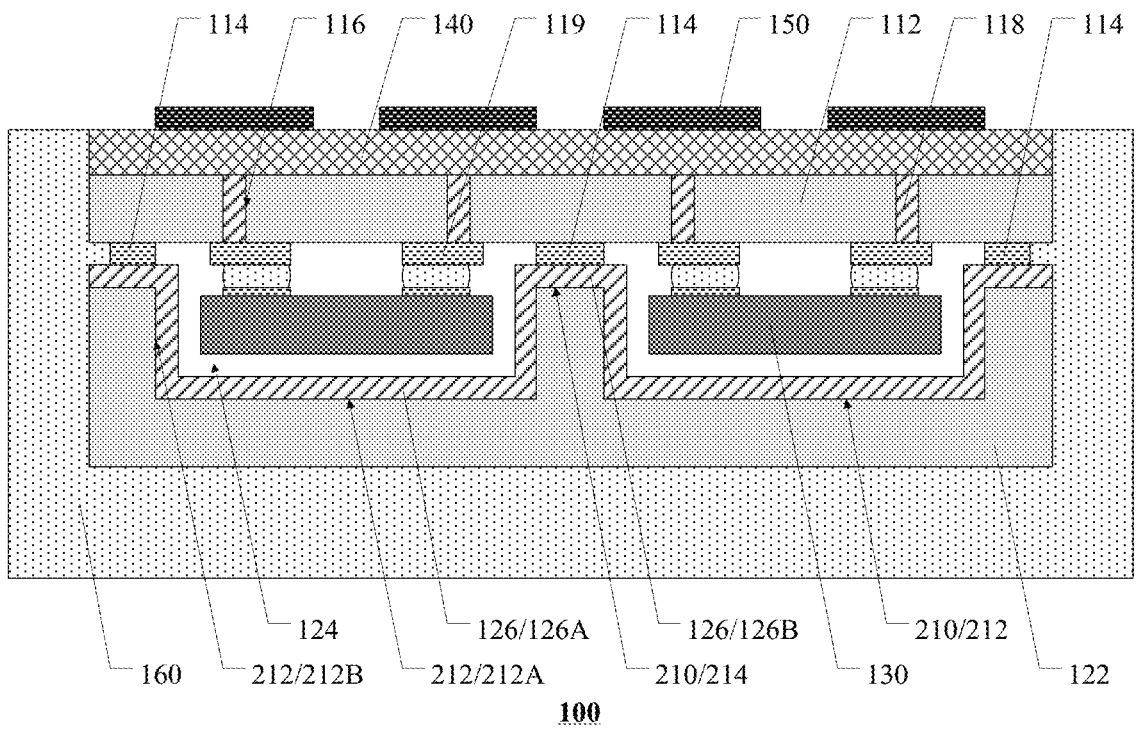
FIG. 3 is a structural schematic diagram of another radio frequency front-end module according to an embodiment of the present disclosure.

An embodiment of the present disclosure also provides another radio frequency front-end module. FIG. 3 is a structural schematic diagram of another radio frequency front-end module according to an embodiment of the present disclosure.

As illustrated by FIG. 3, the radio frequency front-end module 100 includes a first functional substrate 110, a second functional substrate 120, a first radio frequency front-end component 130, an electrical interconnection structure 140 and an array pad 150. The structures, positional relationships and functions of the first functional substrate 110, the second functional substrate 120, the first radio frequency front-end component 130, the electrical interconnection structure 140 and the array pad 150 can be referred to the relevant description of FIG. 1, and are not repeated here. Therefore, the radio frequency front-end module also has the following beneficial effects: (1) the radio frequency front-end module does not need to package the first radio frequency front-end module at wafer level, and the cavity required by the first radio frequency front-end module can be formed by the groove in the second base substrate, thereby reducing the manufacturing cost of the radio frequency front-end module; (2) the radio frequency front-end module can not only achieve the bonding function, but also the electromagnetic interference shielding function of the first radio frequency front-end module through the bonding metal layer, and the extra shielding structure is omitted, thereby reducing the packaging cost of the radio frequency front-end module; (3) the structure of the radio frequency front-end module is relatively simple, and the product size is small.

In some examples, as illustrated by FIG. 3, the radio frequency front-end module 100 further includes a plastic molding structure 160; the plastic molding structure 160 wraps the surface of the second functional substrate 120 away from the first functional substrate 110, the lateral surface of the second functional substrate 120 and the lateral surface of the first functional substrate 110. Therefore, the radio frequency front-end module can improve the ability of the radio frequency front-end module to prevent water and oxygen intrusion through the plastic molding structure, thereby improving the durability and service life of products.

Figure 4:
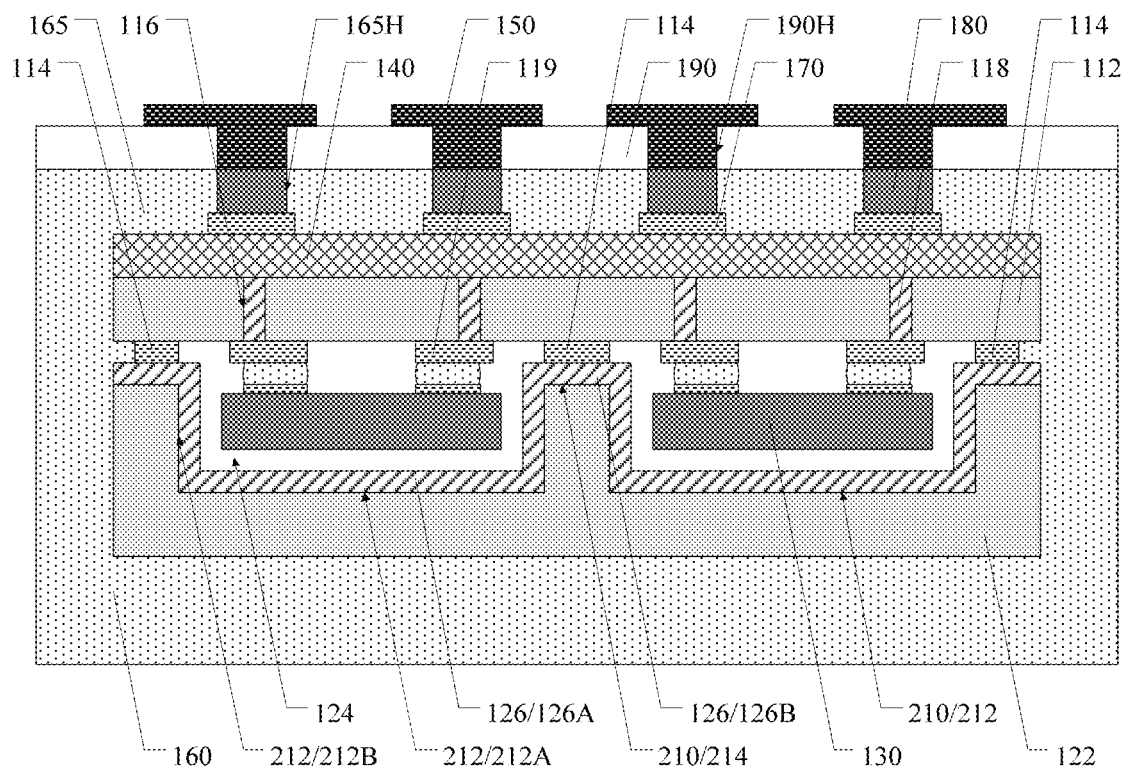
FIG. 4 is a structural schematic diagram of another radio frequency front-end module according to an embodiment of the present disclosure.

An embodiment of the present disclosure also provides another radio frequency front-end module. FIG. 4 is a structural schematic diagram of another radio frequency front-end module according to an embodiment of the present disclosure.

As illustrated by FIG. 4, the radio frequency front-end module 100 includes a first functional substrate 110, a second functional substrate 120, a first radio frequency front-end component 130, an electrical interconnection structure 140 and a package structure 160. The structures, positional relationships and functions of the first functional substrate 110, the second functional substrate 120, the first radio frequency front-end component 130, the electrical interconnection structure 140 and the package structure 160 can be referred to the relevant description of FIG. 1, and will not be repeated here.

Different from the radio frequency front-end module shown in FIG. 3, as illustrated by FIG. 4, the plastic molding structure 160 wraps the surface of the second functional substrate 120 away from the first functional substrate 110, the surface of the first functional substrate 110 away from the second functional substrate 120, the lateral surface of the second functional substrate 120 and the lateral surface of the first functional substrate 110. Therefore, the plastic molding structure can better seal the radio frequency front-end module, and improve the ability of preventing water and oxygen intrusion of the radio frequency front-end module, thus further improving the durability and service life of products.

In some examples, as illustrated by FIG. 4, the radio frequency front-end module 100 further includes a metal pad 170, a conductive support column 180, a passivation layer 190 and an array pad 150. The metal pad 170 is located at a side of the electrical interconnection structure 150 away from the first functional substrate 110; the conductive support column 180 is located at a side of the metal pad 170 away from the electrical interconnection structure 140; the passivation layer 190 is located at a side of the conductive support column 180 away from the first functional substrate 110; the array pad 150 is located at a side of the passivation layer 190 away from the plastic molding structure 160. The plastic molding structure 160 further includes an upper molding portion 165 located on the first functional substrate 110 away from the second functional substrate 120, and the upper molding portion 165 includes a first through hole 165H in which the conductive support column 180 is located, that is, the upper molding portion 165 wraps the conductive support column 180. The passivation layer 190 includes a second through hole 190H, and the array pad 150 is connected to the metal pad 170 through the second through hole 190H and the conductive support column 180 located in the first through hole 165H.

In the radio frequency front-end module provided in this example, by setting the conductive support column, the plastic molding structure can form the upper molding portion located at the first functional substrate away from the second functional substrate in the plastic molding process, so that the plastic molding structure can completely wraps the first functional substrate, the second functional substrate, the first radio frequency front-end component and the electrical interconnection structure. Therefore, the radio frequency front-end module can better seal the radio frequency front-end module, and improve the ability of preventing water and oxygen intrusion of the radio frequency front-end module.

Figure 5:
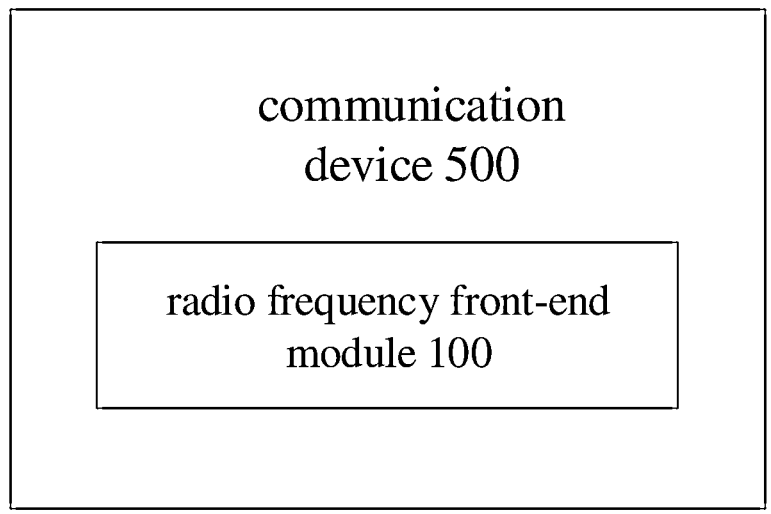
FIG. 5 is a schematic diagram of a communication device according to an embodiment of the present disclosure.

An embodiment of the present disclosure also provides a communication device. FIG. 5 is a schematic diagram of a communication device according to an embodiment of the present disclosure. As illustrated by FIG. 5, the communication device 500 includes the aforementioned radio frequency front-end module 100. Therefore, the communication device has the beneficial effects corresponding to those of the radio frequency front-end module. For example, the communication device also has the advantages of low cost, high durability and long service life.

For example, the communication device can be a mobile phone, a smart watch, a smart bracelet, a notebook computer, a tablet computer and other electronic products.

Figure 6:
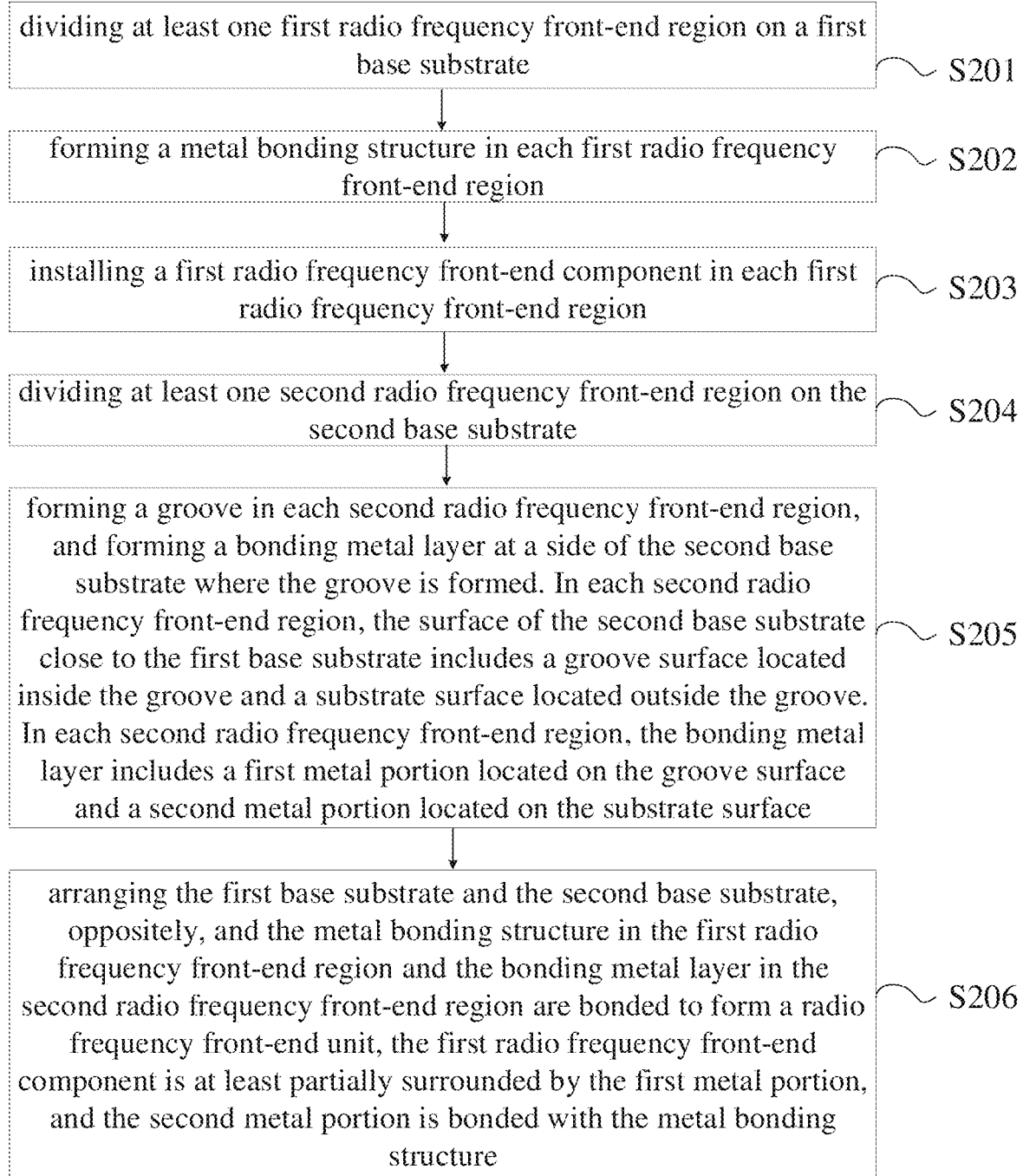
FIG. 6 is a flowchart of a manufacturing method of a radio frequency front-end module according to an embodiment of the present disclosure.

An embodiment of the present disclosure also provides a manufacturing method of the radio frequency front-end module. FIG. 6 is a flowchart of a manufacturing method of a radio frequency front-end module according to an embodiment of the present disclosure. As illustrated by FIG. 6, the manufacturing method of the radio frequency front-end module includes the following steps S201-S206.

S201, dividing at least one first radio frequency front-end region on a first base substrate.

S202: forming a metal bonding structure in each first radio frequency front-end region.

S203: installing a first radio frequency front-end component in each first radio frequency front-end region.

S204, dividing at least one second radio frequency front-end region on the second base substrate.

S205: forming a groove in each second radio frequency front-end region, and forming a bonding metal layer at a side of the second base substrate where the groove is formed. In each second radio frequency front-end region, the surface of the second base substrate close to the first base substrate includes a groove surface located inside the groove and a substrate surface located outside the groove. In each second radio frequency front-end region, the bonding metal layer includes a first metal portion located on the groove surface and a second metal portion located on the substrate surface.

S206: arranging the first base substrate and the second base substrate, oppositely, and the metal bonding structure in the first radio frequency front-end region and the bonding metal layer in the second radio frequency front-end region are bonded to form a radio frequency front-end unit, the first radio frequency front-end component is at least partially surrounded by the first metal portion, and the second metal portion is bonded with the metal bonding structure.

In the manufacturing method of the radio frequency front-end module provided by the embodiment of the present disclosure, after the first base substrate and the second base substrate are oppositely arranged and the metal bonding structure in the first radio frequency front-end region and the bonding metal layer in the second radio frequency front-end region are bonded, a cavity can be formed between the first base substrate and the groove, thus providing a cavity structure for the first radio frequency front-end component such as a filter, so the radio frequency front-end module does not need wafer-level package of the first radio frequency front-end component, and the cavity required by the first radio frequency front-end component can be formed by the groove in the second base substrate. In addition, the first radio frequency front-end module is at least partially surrounded by the first metal portion, and the second metal portion is bonded with the metal bonding structure, so the radio frequency front-end module can not only achieve the bonding function, but also achieve the electromagnetic interference shielding function of the first radio frequency front-end module through the bonding metal layer, and the extra shielding structure is omitted, thereby reducing the packaging cost of the radio frequency front-end module. On the other hand, because the radio frequency front-end module omits the related structure and shielding structure of wafer-level package, the structure of the radio frequency front-end module is relatively simple and the product size is small.

FIGS. 7A-7M are schematic diagrams of steps of a manufacturing method of a radio frequency front-end module according to an embodiment of the present disclosure.

Figure 7A:
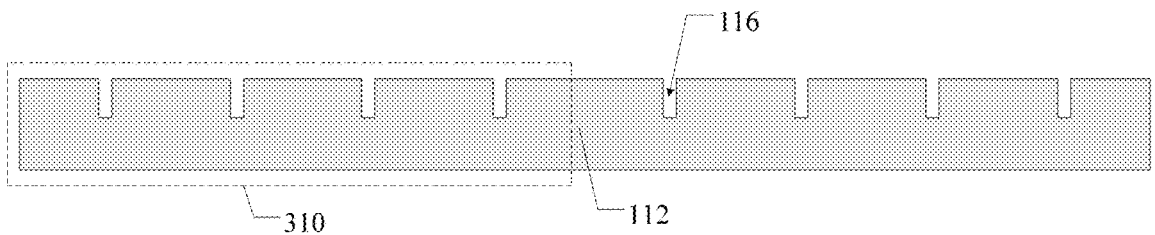
FIGS. 7A-7M are schematic diagrams of steps of a manufacturing method of a radio frequency front-end module according to an embodiment of the present disclosure.

As illustrated by FIG. 7A, a substrate blind hole 116 is formed in each first radio frequency front-end region 310 of the first base substrate 110.

Figure 7B:
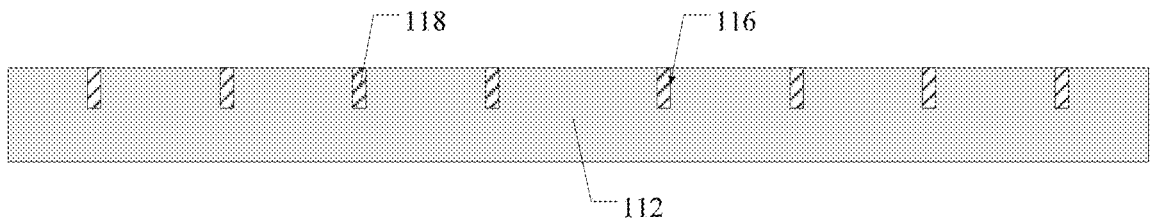
Figure 7C:
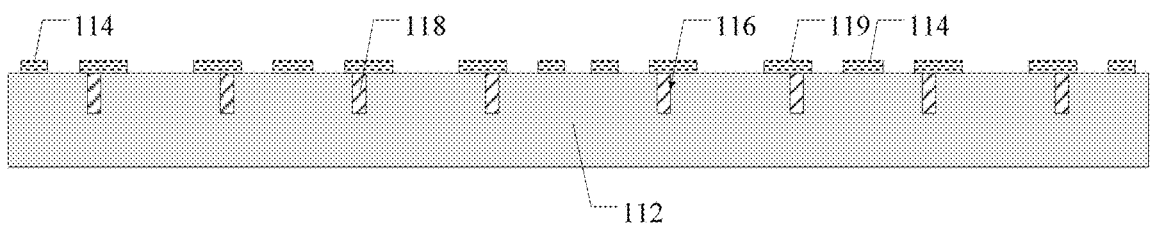

As illustrated by FIG. 7B, the substrate blind hole 116 is filled with conductive material to form a first conductive structure 118 located in the substrate blind hole 116;

As illustrated by FIG. 7C, a flip-chip pad 119 connected to the first conductive structure 118 is formed on the first conductive structure 118.

Figure 7D:
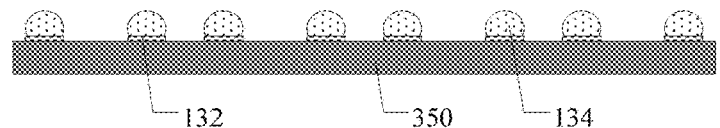

As illustrated by FIG. 7D, a wafer 350 including the first radio frequency front-end component 130 is acquired. For example, the first radio frequency front-end component can be a filter, a low noise amplifier, a power amplifier, etc.

For example, as illustrated by FIG. 7D, a bonding pad 132 of each first radio frequency front-end component 130 can also be provided with a tin solder ball 134.

Figure 7E:
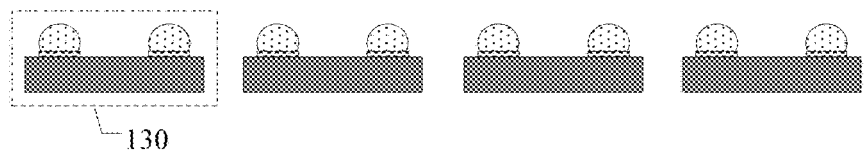

As illustrated by FIG. 7E, the wafer 350 is cut to obtain the first radio frequency front-end component 130.

Figure 7F:
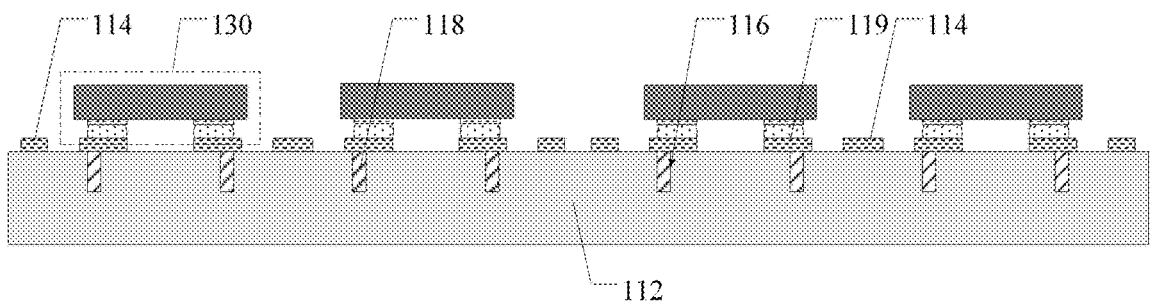

As illustrated by FIG. 7F, the first radio frequency front-end component 130 is soldered on the flip-chip pad 119. At this time, the first functional substrate and the first radio frequency front-end component soldered on the flip-chip pad can be a radio frequency front-end module to be bonded.

Figure 7G:
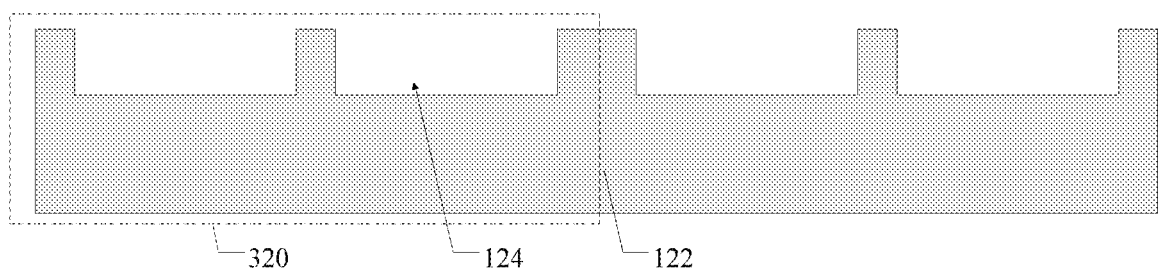

As illustrated by FIG. 7G, a groove 124 is formed in each second radio frequency front end region 320 of the second base substrate 122.

Figure 7H:
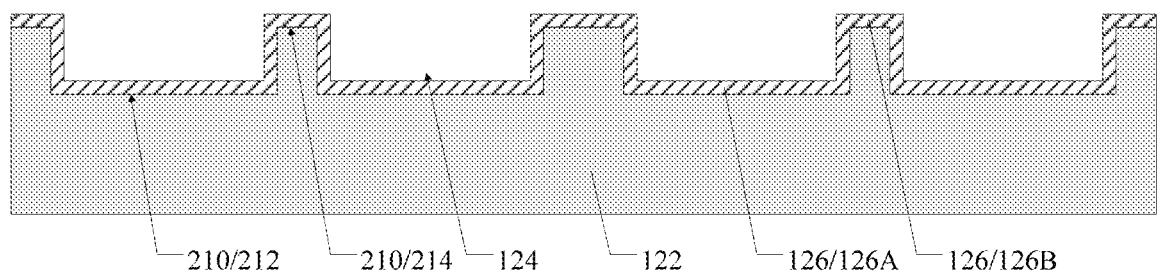

As illustrated by FIG. 7H, a bonding metal layer 126 is formed at a side of the second base substrate 122 where the groove 124 is formed. In each second radio frequency front-end region 320, the surface 210 of the second base substrate 122 close to the first base substrate 112 includes a groove surface 212 located inside the groove 124 and a substrate surface 214 located outside the groove 124. In each second radio frequency front-end region 320, the bonding metal layer 126 includes a first metal portion 126A located on the groove surface 212 and a second metal portion 126B located on the substrate surface 214. At this time, the second base substrate and the bonding metal layer can form a second functional substrate, which can be a cover body to be bonded.

Figure 7I:
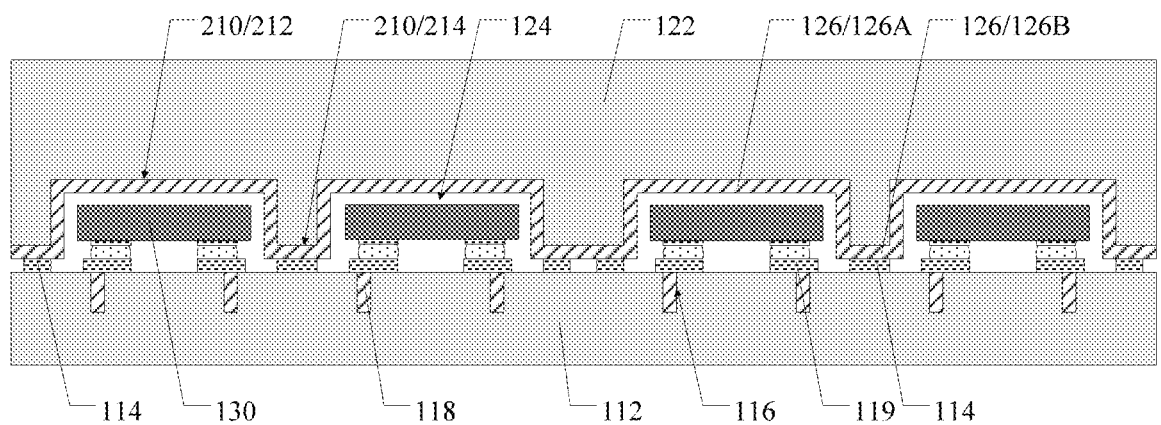

As illustrated by FIG. 7I, the second base substrate 122 and the first base substrate 112 are oppositely disposed, and the metal bonding structure 114 in the first radio frequency front-end region 310 and the bonding metal layer 126 in the second radio frequency front-end region 320 are bonded to form the radio frequency front-end unit 100. The first radio frequency front-end component 130 is at least partially surrounded by the first metal portion 126A, and the second metal portion 126B is bonded to the metal bonding structure 114.

Figure 7J:
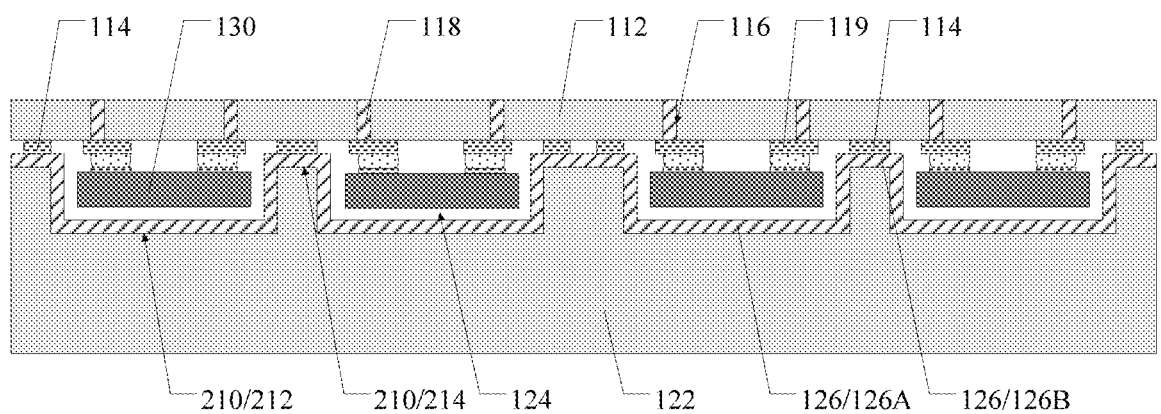

As illustrated by FIG. 7J, the first base substrate 112 is thinned to expose the substrate blind holes 116 in each first radio frequency front-end region 310 to form a substrate through holes 116.

Figure 7K:
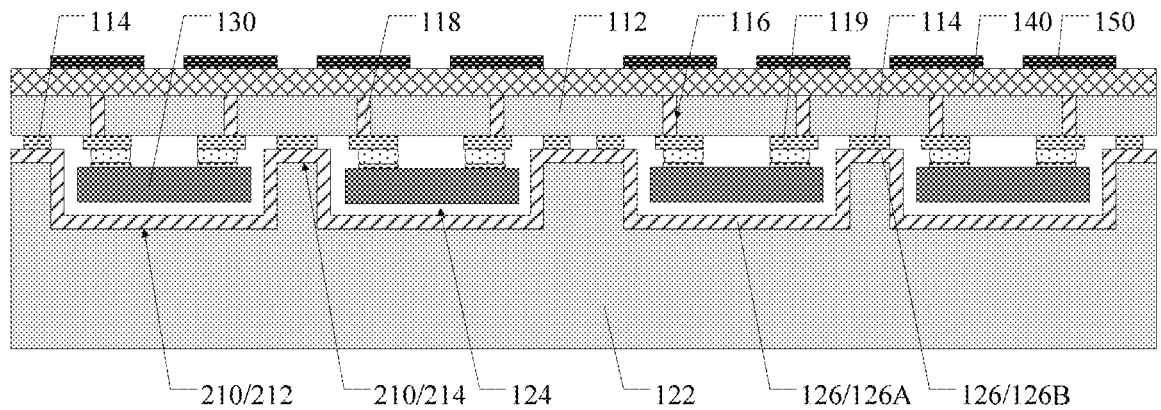

As illustrated by FIG. 7K, an electrical interconnection structure 140 is formed at a side of the first base substrate 112 away from the second base substrate 122. An array pad 150 is formed at a side of the electrical interconnection structure 140 away from the first base substrate 112, and the electrical interconnection structure 140 is connected with the first conductive structure 118.

Figure 7L:
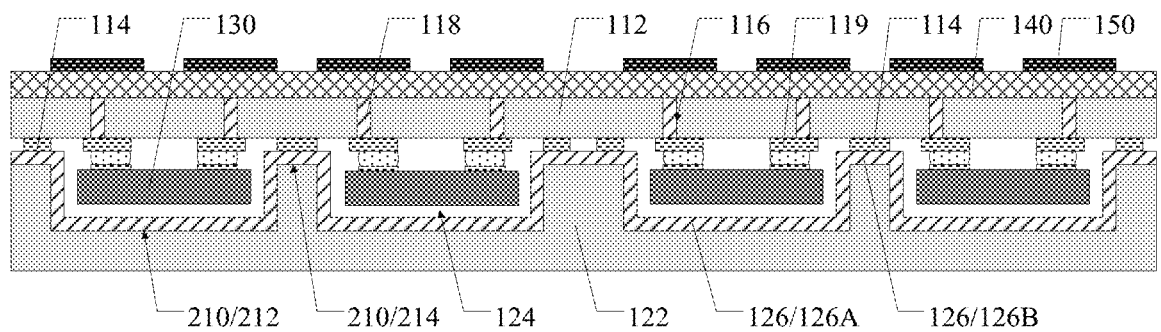

As illustrated by FIG. 7L, the second base substrate 122 is thinned.

Figure 7M:
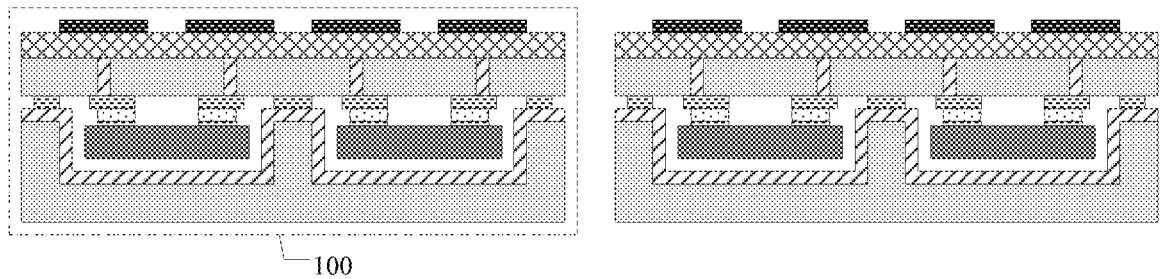

As illustrated by FIG. 7M, the first base substrate 112 and the second base substrate 122 are cut to separate a plurality of radio frequency front-end units 100. At this time, the first base substrate 112 includes a plurality of first radio frequency front-end regions 310, and the second base substrate 122 includes a plurality of second radio frequency front-end regions 320. The first radio frequency front-end regions 310 and the second radio frequency front-end regions 320 are arranged in one-to-one correspondence. Each radio frequency front-end unit 100 corresponds to the radio frequency front-end module 100 shown in FIG. 1.

FIGS. 8A-8D are schematic diagrams of steps of a manufacturing method of a radio frequency front-end module according to an embodiment of the present disclosure.

Figure 8A:
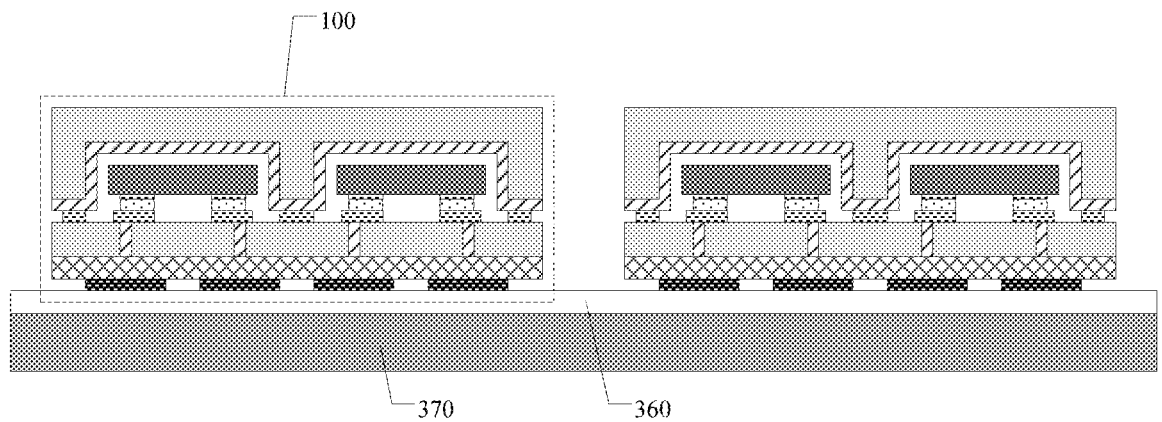
FIGS. 8A-8D are schematic diagrams of steps of a manufacturing method of a radio frequency front-end module according to an embodiment of the present disclosure.

As illustrated by FIG. 8A, a plurality of radio frequency front-end units 100 shown in FIG. 7M are rearranged on a temporary carrier 370 through a temporary adhesive layer 360. At this time, the second base substrate 122 of each radio frequency front-end unit 100 is located at a side of the first base substrate 112 away from the temporary carrier 370.

Figure 8B:
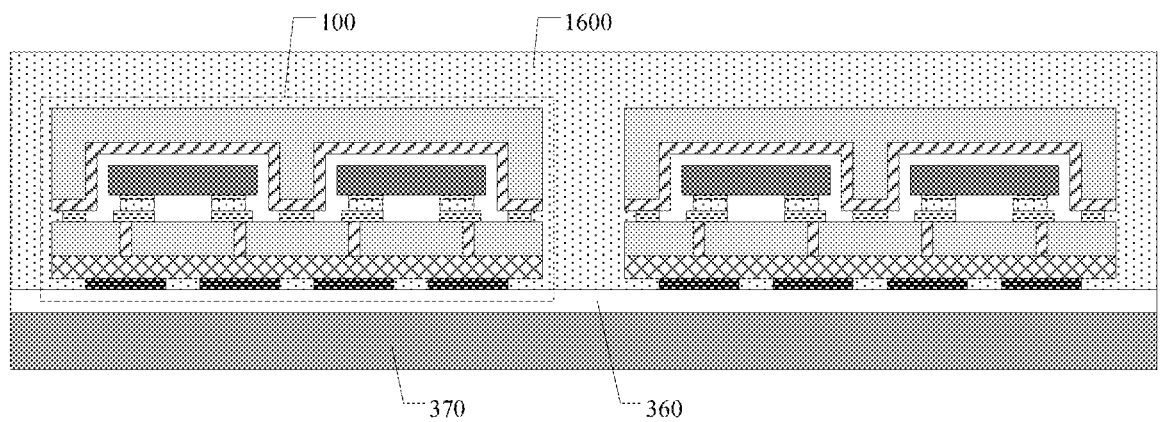

As illustrated by FIG. 8B, plastic material is coated at a side of a plurality of radio frequency module units 100 and a temporary carrier 370 to wrap each radio frequency front-end unit 100.

Figure 8C:
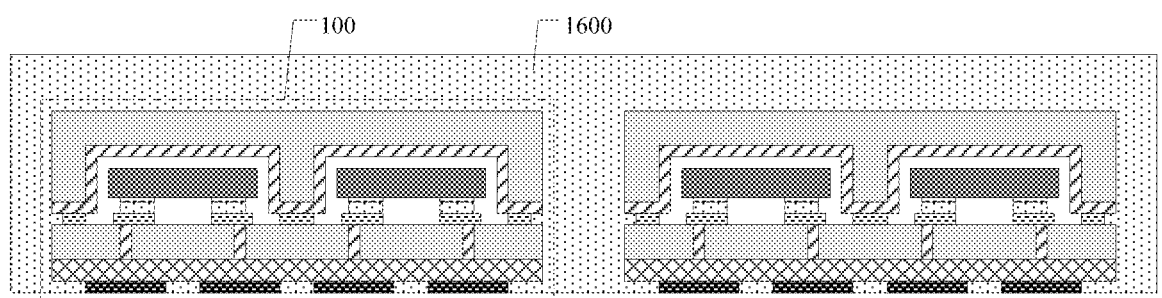

As illustrated by FIG. 8C, the temporary adhesive layer 360 and the temporary carrier plate 370 are removed.

Figure 8D:
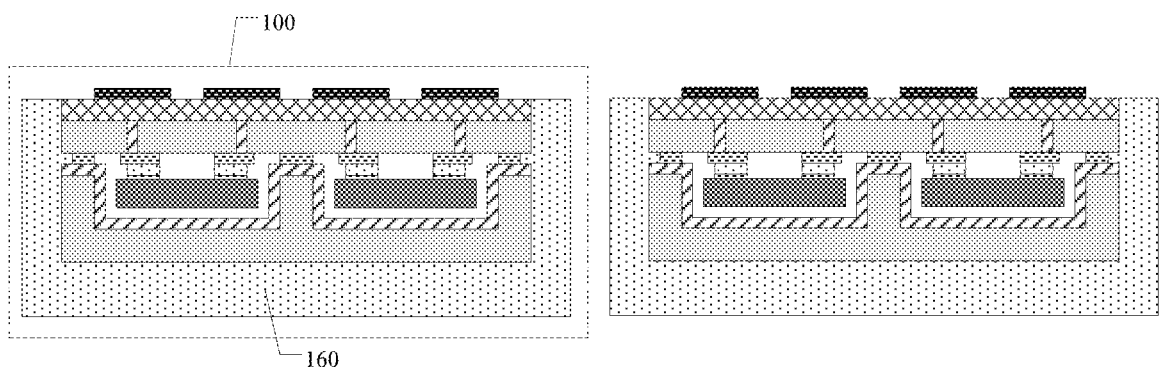

As illustrated by FIG. 8D, the plastic material 1600 is cut to separate a plurality of radio frequency front-end units 100 including the plastic material 1600. At this time, the plastic material 1600 included in each radio frequency front-end unit 100 can be the above-mentioned plastic molding structure 160.

FIGS. 9A-9H are schematic diagrams of steps of a manufacturing method of a radio frequency front-end module according to an embodiment of the present disclosure.

Figure 9A:
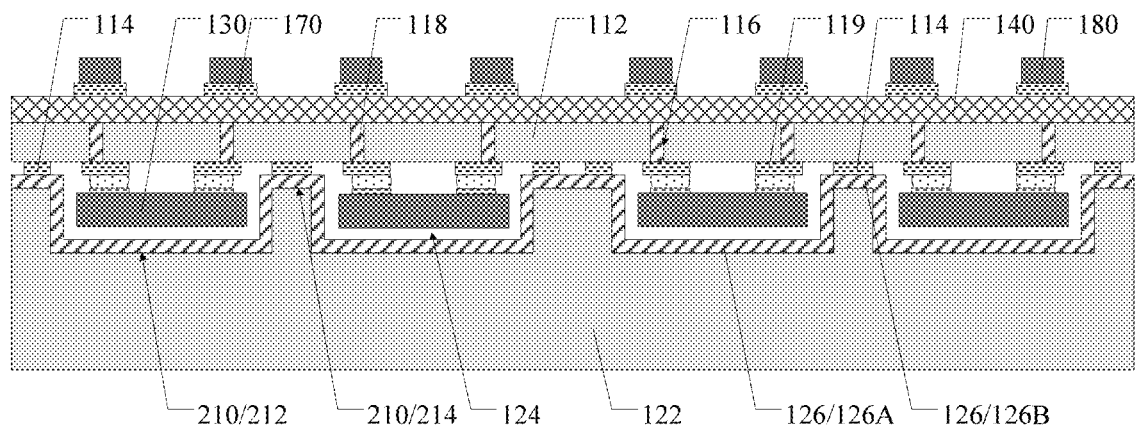
FIGS. 9A-9H are schematic diagrams of steps of a manufacturing method of a radio frequency front-end module according to an embodiment of the present disclosure.

As illustrated by FIG. 9A, on the basis of the structure shown in FIG. 7J, an electrical interconnection structure 140 is formed at a side of the first base substrate 112 away from the second base substrate 122; a metal pad 170 is formed on the surface of the electrical interconnection structure 140 away from the first base substrate 110; and a conductive support column 180 is formed at a side of the metal pad 170 away from the first base substrate 112.

For example, the conductive support column 180 may be a metal column or a tin solder ball.

Figure 9B:
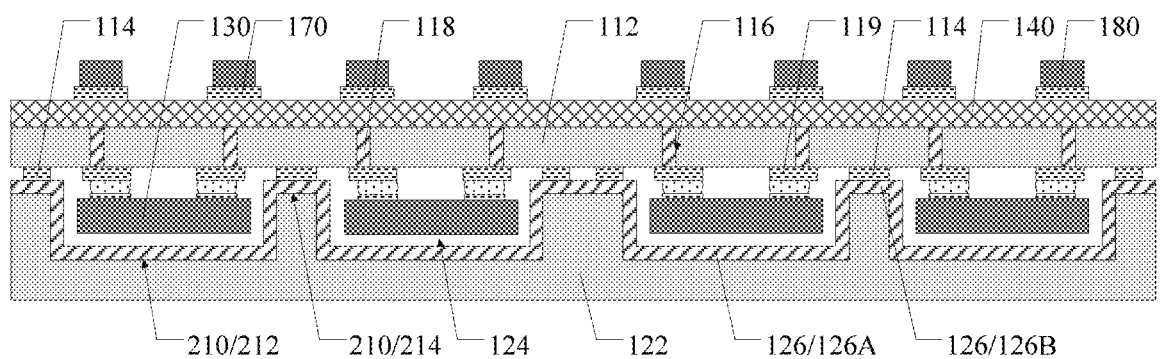

As illustrated by FIG. 9B, the second base substrate 122 is thinned.

Figure 9C:
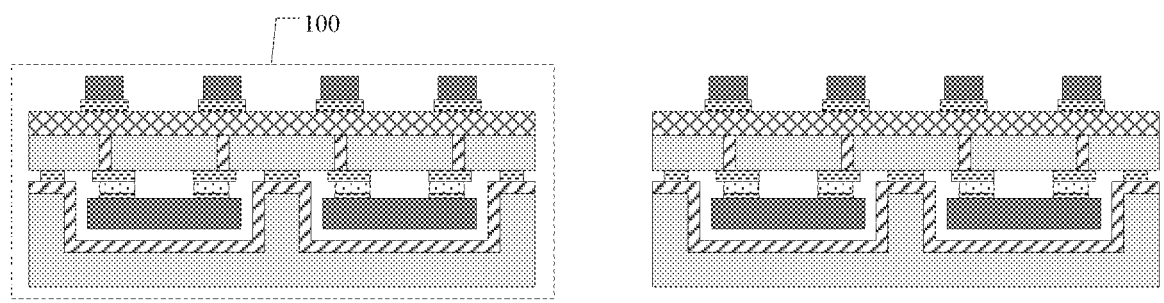

As illustrated by FIG. 9C, the first base substrate 112 and the second base substrate 122 are cut to separate a plurality of radio frequency front-end units 100. At this time, the first base substrate 112 includes a plurality of first radio frequency front-end regions 310, and the second base substrate 122 includes a plurality of second radio frequency front-end regions 320. The first radio frequency front-end regions 310 and the second radio frequency front-end regions 320 are arranged in one-to-one correspondence.

Figure 9D:
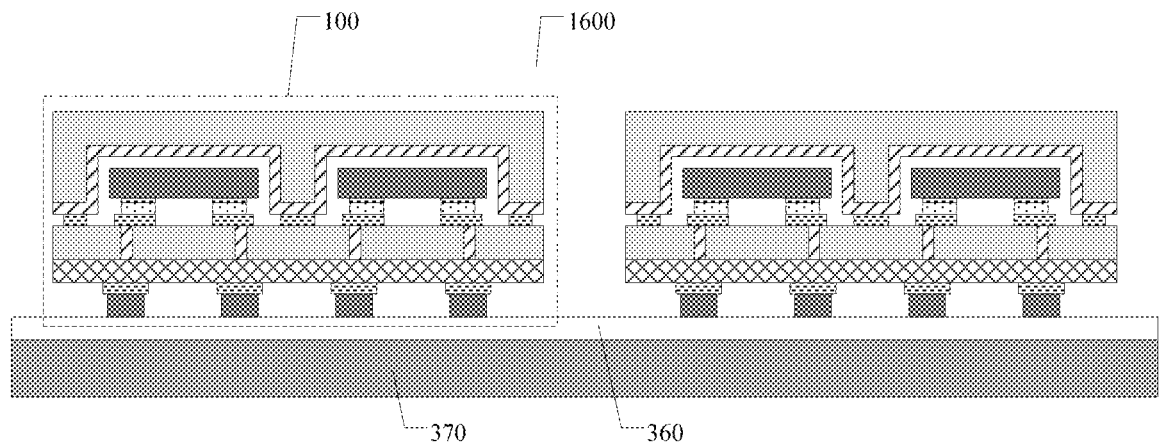

As illustrated by FIG. 9D, a plurality of radio frequency front-end units 100 are rearranged on a temporary carrier 370 through a temporary adhesive layer 360. At this time, the conductive support column 180 of each radio frequency front-end unit 100 is located at a side of the first base substrate 112 close to the temporary carrier plate 370. Thereby, the conductive support column 180 may form a gap between the first base substrate 112 or the electrical interconnection layer 140 and the temporary carrier plate 370.

Figure 9E:
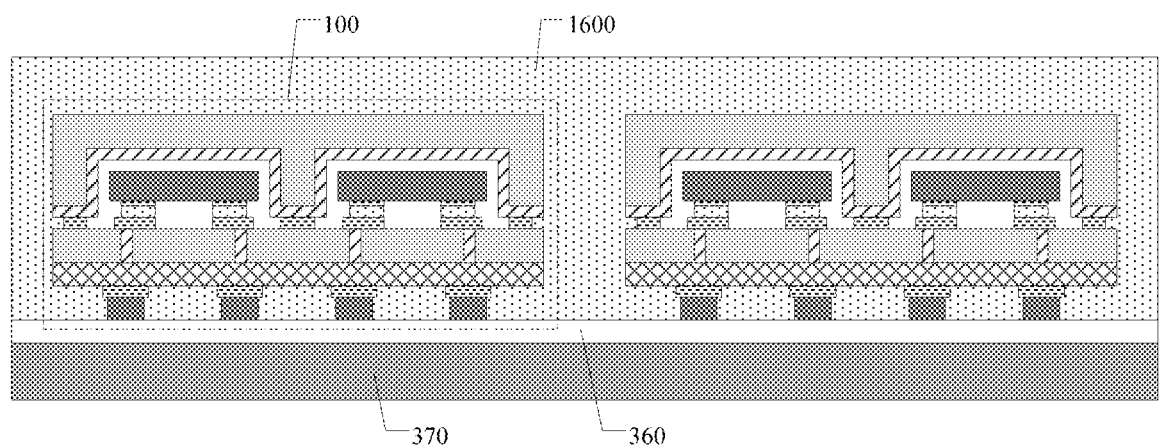

As illustrated by FIG. 9E, a plastic material 1600 is coated at a side of a plurality of radio frequency module units 100 and a temporary carrier 370 to wrap each radio frequency front-end unit 100, and the plastic material 1600 also wraps a conductive support column to form an upper molding portion 165.

Figure 9F:
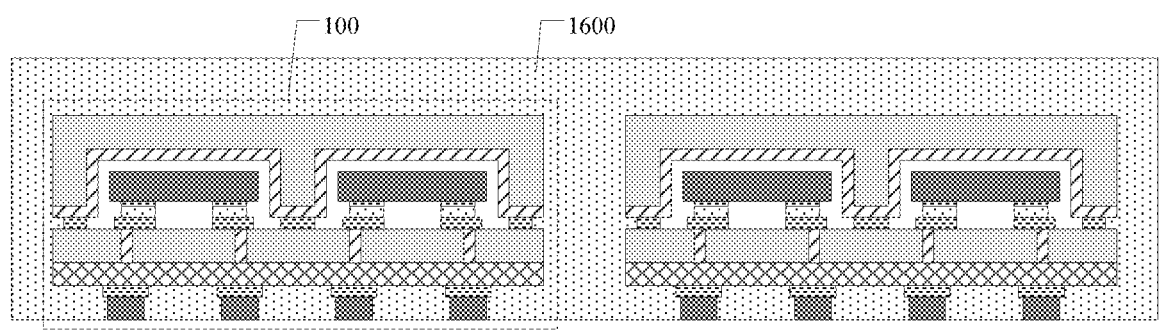

As illustrated by FIG. 9F, the temporary carrier plate 370 and the temporary adhesive layer 360 are removed.

Figure 9G:
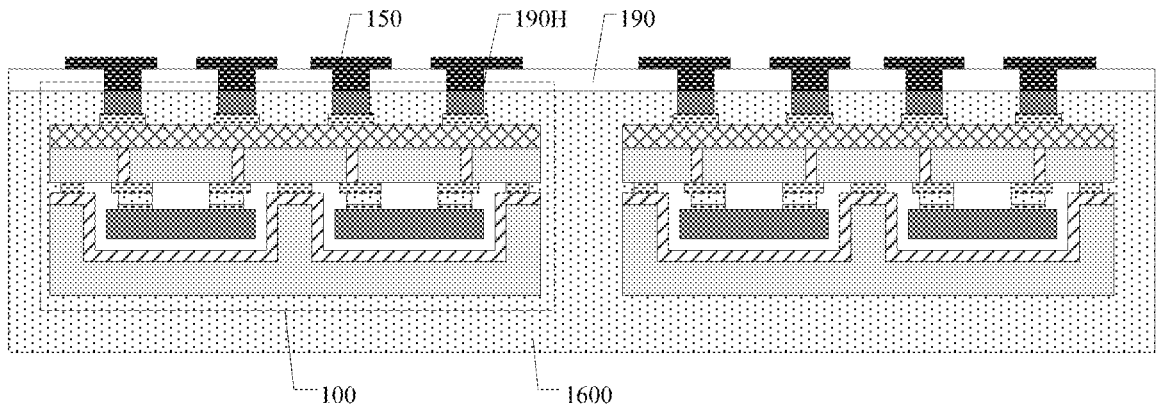

As illustrated by FIG. 9G, a passivation layer 190 is formed at a side of the upper molding portion 165 away from the first base substrate 112; a through hole 190H is formed in the passivation layer 190; the array pad 150 is formed at a side of the passivation layer 190H away from the upper molding portion 165. The array pad 150 is connected to the conductive support column 180 through the through hole 190H.

Figure 9H:
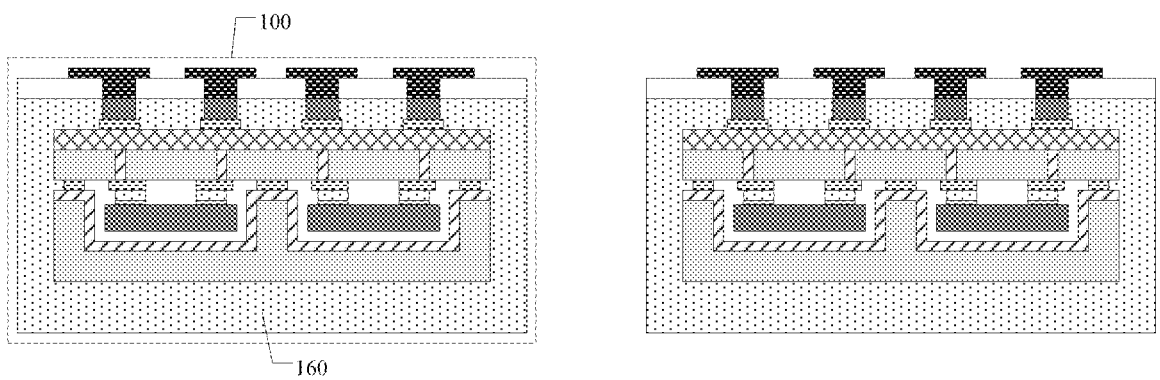

As illustrated by FIG. 9H, the adhesive 1600 and the passivation layer 190 are cut to separate a plurality of radio frequency front-end units 100 including the adhesive 1600. At this time, the plastic material 1600 included in each radio frequency front-end unit 100 can be the plastic molding structure 160 described above.

Figure 10:
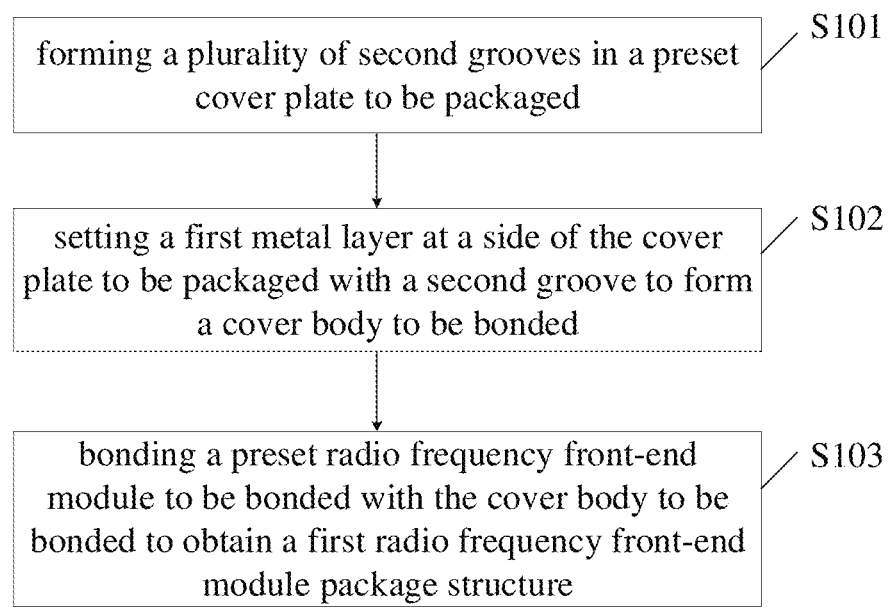
FIG. 10 is a schematic diagram of a packaging method for a radio frequency front-end module according to an embodiment of the present invention.

An embodiment of the present disclosure also provides a packaging method for the radio frequency front-end module. Referring to FIG. 10, an embodiment of the present invention provides a packaging method for a radio frequency front-end module, which includes:

S101: forming a plurality of second grooves in a preset cover plate to be packaged.

S102, setting a first metal layer at a side of the cover plate to be packaged with a second groove to form a cover body to be bonded.

S103, bonding a preset radio frequency front-end module to be bonded with the cover body to be bonded to obtain a first radio frequency front-end module package structure.

By adopting the packaging method for the radio frequency front-end module provided by the embodiment of the present disclosure, a plurality of second grooves are formed on the preset cover plate to be packaged, and a first metal layer is arranged at a side of the cover plate to be packaged with the second groove to form the cover body to be bonded. The preset radio frequency front-end module to be bonded is bonded with the cover body to be bonded. In this way, the first metal layer is disposed on the second groove. The manufacture of the electromagnetic shielding structure can be completed in the process of packaging the radio frequency front-end module to be bonded. There is no need to make a metal layer on the outer surface of the packaged radio frequency module chip one by one as the electromagnetic shielding structure, which can improve the efficiency of making the electromagnetic shielding structure.

It should be noted that the above-mentioned second groove can be a groove in other embodiments; the first metal layer can be a bonding metal layer in other embodiments.

Furthermore, forming a plurality of second grooves on the preset cover plate to be packaged includes: etching the cover plate to be packaged to form a plurality of second grooves. In some embodiments, the cover plate to be packaged is etched by a wet chemical etching process and/or a plasma excited etching process.

Further, setting the first metal layer at a side of the cover plate to be packaged with the second groove includes setting the first metal layer at a side of the cover plate to be packaged with the second groove by electroplating process.

Figure 11:
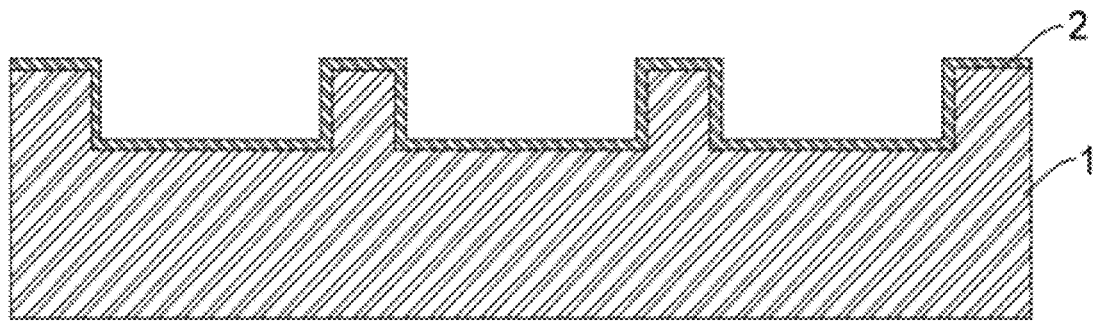
FIG. 11 is a structural diagram of a cover body to be bonded according to an embodiment of the present disclosure.

In some embodiments, FIG. 11 is a structural diagram of a cover body to be bonded. As illustrated by FIG. 11, the cover body to be bonded includes a cover plate 1 to be packaged and a first metal layer 2. The cover plate 1 to be packaged is provided with a plurality of second grooves, and the side of the cover plate 1 to be packaged with the second grooves is provided with a first metal layer 2. The cover plate to be packaged is made of silicon, carbosilicon, aluminum oxide or silicon dioxide. The first metal layer is made of one or more of molybdenum, aluminum, copper, platinum, tantalum, tungsten, palladium and ruthenium with electrical conductivity.

Figure 12:
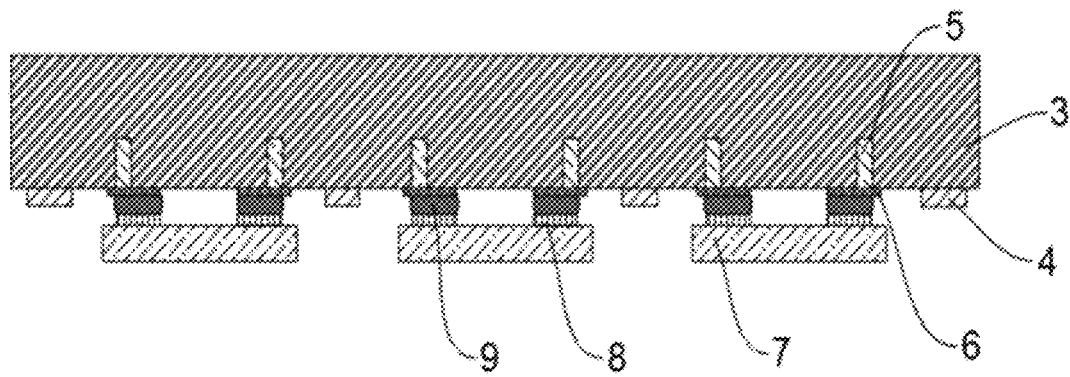
FIG. 12 is a schematic structural diagram of a radio frequency front-end module to be bonded according to an embodiment of the present disclosure.

In some embodiments, FIG. 12 is a structural diagram of a radio frequency front-end module to be bonded. As illustrated by FIG. 12, the radio frequency front-end module to be bonded includes an interposer 3, a second metal layer 4, a first metal column 5, a fourth metal pad 6 and a radio frequency front-end component. The interposer 3 is provided with a second metal layer 4 and a plurality of first grooves, each of the first grooves is filled with a first metal column 5, each first metal column 5 is connected with a fourth metal pad 6, and the fourth metal pad 6 is connected with the radio frequency front-end component. The second metal layer is not in contact with each fourth metal pad. The front-end component includes a first component 7, a fifth metal pad 8 and a first tin solder ball 9. The first component 7 is provided with a fifth metal pad 8, and the fifth metal pad 8 is connected to the fourth metal pad 6 through the first tin solder ball 9. The first component is an unpackaged radio frequency component, such as an unpackaged radio frequency switch, an unpackaged low noise amplifier (LNA), an unpackaged power amplifier (PA), an unpackaged capacitor and an unpackaged inductor. The interposer is made of silicon. The second metal layer is made of one or more of molybdenum, aluminum, copper, platinum, tantalum, tungsten, palladium and ruthenium with electrical conductivity. The first metal column is made of one or more of molybdenum, aluminum, copper, platinum, tantalum, tungsten, palladium and ruthenium with electrical conductivity. The fourth metal pad is made of one or more of molybdenum, aluminum, copper, platinum, tantalum, tungsten, palladium and ruthenium with electrical conductivity. The fifth metal pad is made of one or more of molybdenum, aluminum, copper, platinum, tantalum, tungsten, palladium and ruthenium with electrical conductivity. The first tin solder ball is made of tin or tin-silver alloy.

It should be noted that the above-mentioned unpackaged radio frequency switch is radio frequency switch die, the above-mentioned unpacked low noise power amplifier is low noise power amplifier die, and the above-mentioned unpacked filter is filter die; the first component can be a first radio frequency front-end component.

Furthermore, the radio frequency front-end module to be bonded is provided with an interposer, on which a second metal layer and a plurality of first grooves are arranged, and each first groove is filled with a first metal column, which is connected with a fourth metal pad and the fourth metal pad is connected with the radio frequency front-end component. The cover body to be bonded includes a cover plate to be packaged and a first metal layer, wherein the cover plate to be packaged is provided with a plurality of second grooves, and the first metal layer is arranged at a side of the cover plate to be packaged where the second grooves exist. Bonding the preset radio frequency front-end module to be bonded with the cover body to be bonded includes: bonding the side of the radio frequency front-end module to be bonded with the side of the cover body to be packaged where the second groove and the first metal layer exist. So that the first metal layer is connected with the second metal layer, each radio frequency front-end component is respectively arranged in each second groove, and each radio frequency front-end component, the first metal layer on and the second groove corresponding to each radio frequency front-end component, the second metal layer and the interposer are together enclosed to form a cavity.

It should be noted that the above-mentioned interposer can be the first base substrate in other embodiments; the first groove can be a substrate through hole in other embodiments; the first metal column can be the first conductive structure in other embodiments.

Optionally, after the preset radio frequency front-end module to be bonded is bonded with the to be bonded cover, the method further includes: forming a first metal pad which is electrically interconnected with the radio frequency front-end module to be bonded at a side of the radio frequency front-end module to be bonded away from the to be bonded cover, and obtaining a second radio frequency front-end module package structure. In this way, the first metal pad which is electrically interconnected with the radio frequency front-end module to be bonded is arranged, which is convenient for users to directly use the second radio frequency front-end module package structure.

It should be noted that the above-mentioned first metal pad is the array pad.

Furthermore, the first metal pad is made of one or more of molybdenum, aluminum, copper, platinum, tantalum, tungsten, palladium and ruthenium with electrical conductivity.

Optionally, the radio frequency front-end module to be bonded is provided with an interposer, and the interposer is provided with a plurality of first grooves, each first groove is filled with a first metal column, and each first metal column is connected with a fourth metal pad, and the fourth metal pad is connected with the radio frequency front-end component. Forming a first metal pad electrically interconnected with the radio frequency front-end module to be bonded at a side of the radio frequency front-end module to be bonded away from the cover plate to be packaged includes: thinning a side of the radio frequency front-end module to be bonded away from the cover plate to expose each first metal column; and forming the first metal pad respectively connected with the first metal column. In some embodiments, the radio frequency front-end module to be bonded is thinned by grinding process.

Optionally, the radio frequency front-end module to be bonded is provided with a plurality of first metal columns; forming a first metal pad electrically interconnected with the radio frequency front-end module to be bonded at the side of the radio frequency front-end module to be bonded away from the cover plate to be packaged includes: thinning the side of the radio frequency front-end module to be bonded away from the cover plate to expose each first metal column; arranging an electrical interconnection layer at a side of the radio frequency front-end module to be bonded, which is exposed from each first metal column; and forming a first metal pad electrically interconnected with each first metal column at a side of the electrical interconnection layer away from the radio frequency front-end module to be bonded. The electrical interconnection layer is a Redistribution Layer (RDL).

In some embodiments, the electrical interconnection layer is provided by an RDL process. In this way, by arranging the electrical interconnection layer, the position of the first metal pad can be modified, which is convenient for the user to set the first metal pad at the required position.

Optionally, one side of the electrical interconnection layer away from the radio frequency front-end module to be bonded is provided with a second metal pad and a third metal pad; a first metal pad electrically interconnected with each first metal column is formed at a side of the electrical interconnection layer away from the radio frequency front-end module to be bonded, which includes: forming a second metal column on the second metal pad. The radio frequency module component is electrically connected on the third metal pad. Plastic molding is carried out at a side of the electrical interconnection layer away from the radio frequency front-end module to be bonded to form a plastic molding structure. the plastic molding structure is thinned to expose the second metal columns. The first metal pads respectively connected with the second metal columns are formed. The radio frequency module component is a packaged radio frequency device with a cavity structure. In this way, by sticking the radio frequency components on both sides of the interposer, the efficiency of manufacturing the electromagnetic shielding structure can be improved, and at the same time, the second radio frequency front-end module package structure can be provided with more radio frequency module components. So that the package size is smaller than other package structures provided with the same number of radio frequency module components.

It should be noted that the second metal pad can be a second pad. The third metal pad can be the first pad. The second metal column may be a second conductive structure.

Furthermore, the second metal pad is made of one or more of molybdenum, aluminum, copper, platinum, tantalum, tungsten, palladium and ruthenium with electrical conductivity.

Furthermore, the third metal pad is made of one or more of molybdenum, aluminum, copper, platinum, tantalum, tungsten, palladium and ruthenium with electrical conductivity.

Further, forming the first metal pads respectively connected with the second metal columns includes: forming a passivation layer at a side of the plastic molding structure where the second metal columns are exposed. A first metal pad connecting each second metal column is formed on the passivation layer. The passivation layer is made of photosensitive materials such as polymide (PI) or dry film. In this way, by setting the passivation layer, the efficiency of manufacturing the electromagnetic shielding structure can be improved, and at the same time, the radio frequency module components and radio frequency front-end components can be better protected.

Further, forming the first metal pad connected with the second metal column on the passivation layer includes: exposing and developing the passivation layer to expose the second metal column; depositing a third metal layer on the passivation layer exposing the second metal column; and etching the third metal layer to form the first metal pad respectively connected with the second metal column. The first metal pads are not in contact with each other.

It is to be noted that, the abovementioned first metal pad can be an array pad.

In some embodiments, the deposition is performed by a CVD (Chemical Vapor Deposition) process and/or a PVD (physical Vapor Deposition) process.

Figure 13:
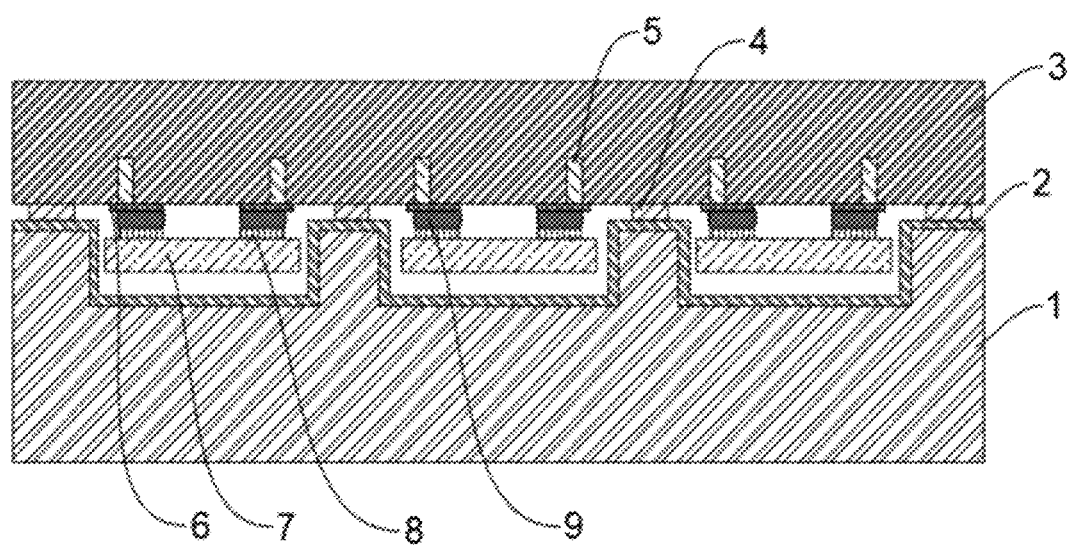
FIG. 13 is a schematic diagram of a bonding structure of a radio frequency front-end module to be bonded and a cover body to be bonded according to an embodiment of the present disclosure.
Figure 14:
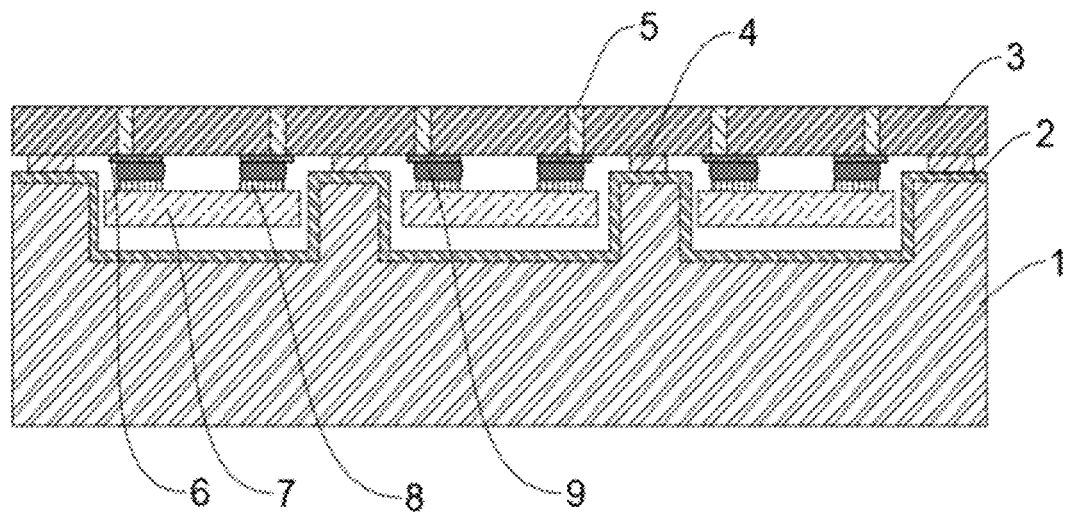
FIG. 14 is a schematic diagram of a structure after etching a metal layer according to an embodiment of the present disclosure.
Figure 15:
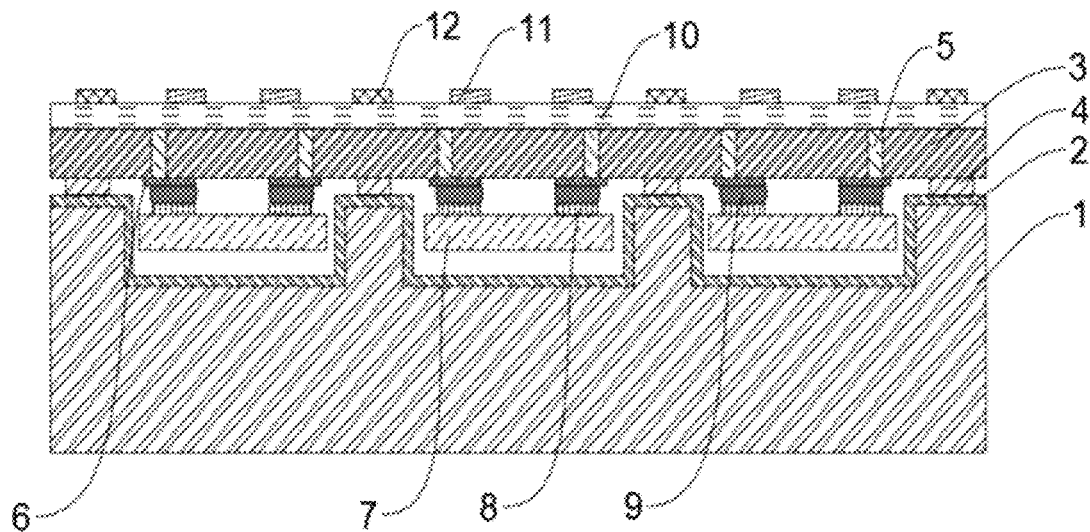
FIG. 15 is a schematic structural diagram of a thinned radio frequency front-end die to be bonded according to an embodiment of the present disclosure.
Figure 16:
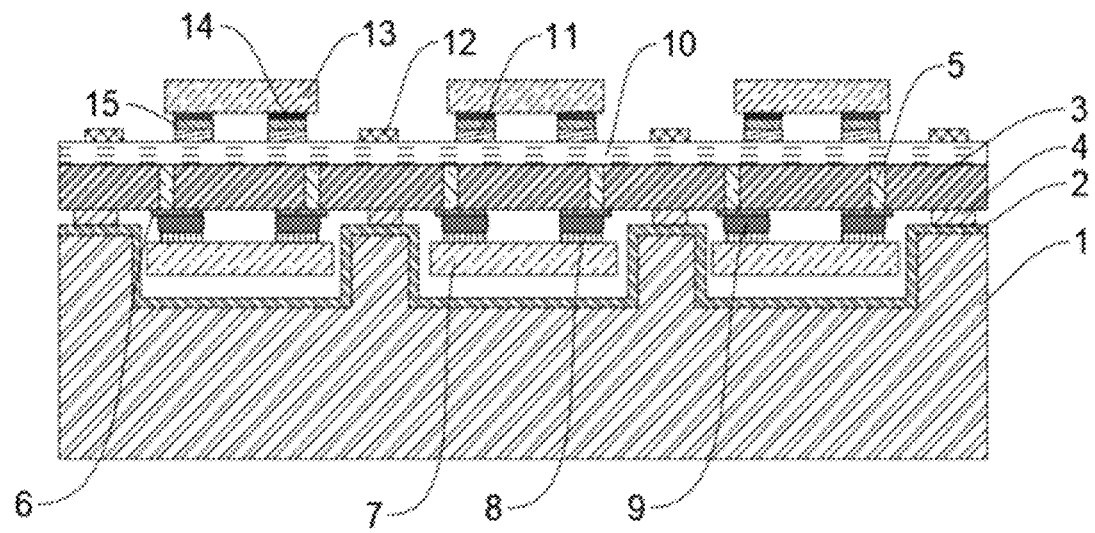
FIG. 16 is a schematic diagram of a structure after an electrical interconnection layer is provided according to an embodiment of the present disclosure.
Figure 17:
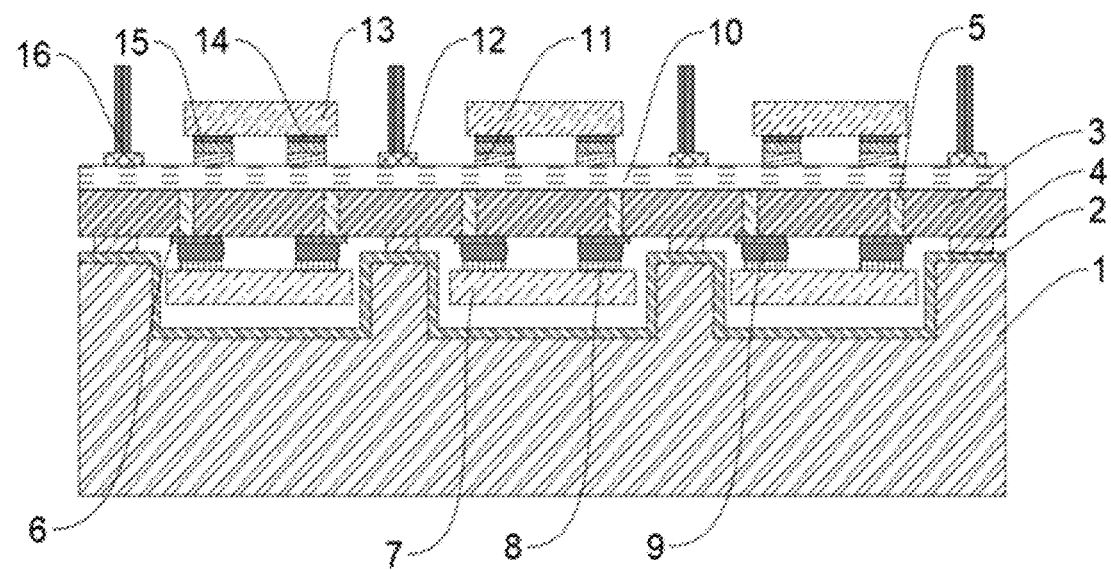
FIG. 17 is a schematic diagram of a structure after a radio frequency module component is arranged on an electrical interconnection layer according to an embodiment of the present disclosure.
Figure 18:
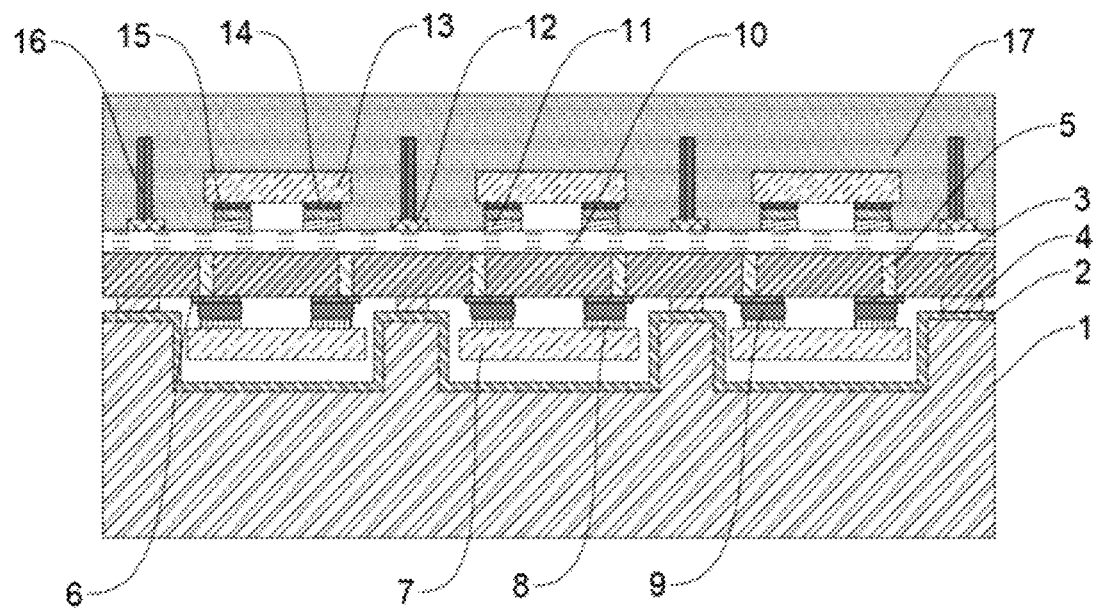
FIG. 18 is a schematic structural diagram of a second metal column formed on an electrical interconnection layer according to an embodiment of the present disclosure.
Figure 19:
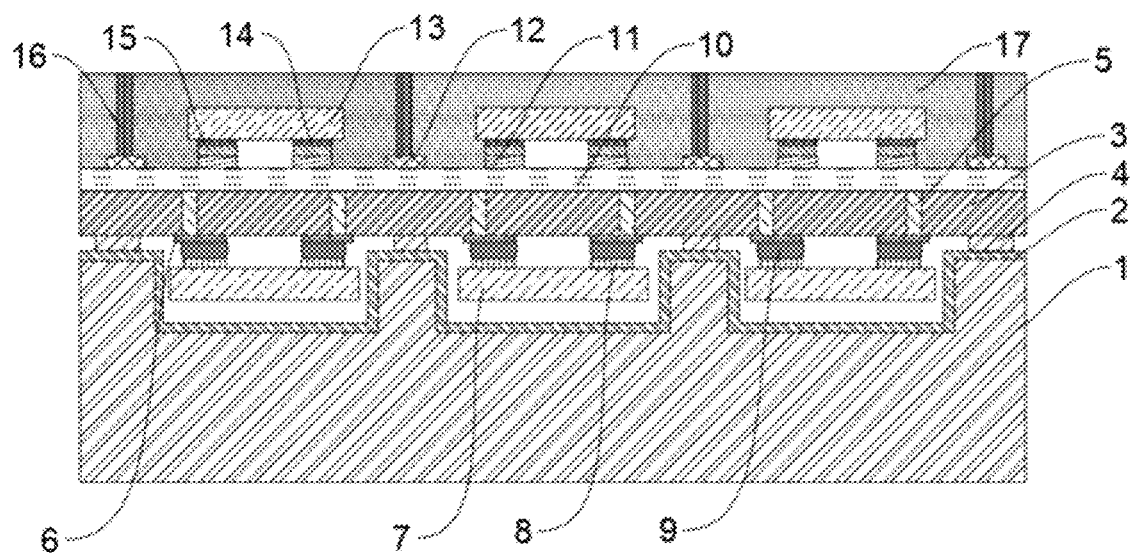
FIG. 19 is a schematic diagram of a structure after forming a passivation layer according to an embodiment of the present disclosure.

In some embodiments, after the preset radio frequency front-end module to be bonded and the cover body to be bonded are bonded, the bonding structure diagram of the radio frequency front-end module to be bonded and the cover body to be bonded as illustrated by FIG. 13 is obtained. Referring to FIG. 14 to FIG. 20, the side of the radio frequency front-end module to be bonded away from the cover plate to be packaged is thinned to expose the first metal columns 5. An electrical interconnection layer 10 is provided at a side of the radio frequency front-end module to be bonded, where each first metal column 5 is exposed. A second metal pad 12 and a third metal pad 11 are arranged at a side of the electrical interconnection layer away from the radio frequency front-end module to be bonded. The radio frequency module component is electrically connected to the third metal pad 11. The radio frequency module component includes a second component 13, a sixth metal pad 14 and a second tin solder ball 15. The second component 13 is provided with a sixth metal pad 14, and the sixth metal pad 14 is connected to the third metal pad 11 through the second tin solder ball 15. A second metal column 16 is formed on the second metal pad 12. Plastic molding is carried out at a side of the electrical interconnection layer away from the radio frequency front-end module to be bonded to form a first plastic molding structure. The first plastic molding structure includes a first plastic molding layer 17, second metal pads 12 wrapped in the first plastic molding layer 17, second metal columns 16 arranged on the second metal pads 12, third metal pads 11 and radio frequency module components arranged on the third metal pads 11. The plastic molding structure is thinned to expose the second metal columns 16. A passivation layer 18 is formed at a side of the plastic molding structure exposed to the second metal column; the passivation layer 18 is thinned to expose the second metal columns 16; a first metal pad 19 connecting the second metal columns is formed on the passivation layer 18. The second component is a packaged radio frequency component with a cavity structure, such as a packaged radio frequency switch, packaged LNA, packaged PA, packaged capacitor, packaged inductor or WLP (Wafer Level Packaging) filter chip.

It should be noted that the second component can be a second radio frequency front-end component.

Furthermore, the sixth metal pad is made of one or more of molybdenum, aluminum, copper, platinum, tantalum, tungsten, palladium and ruthenium with electrical conductivity.

Furthermore, the second tin solder ball is made of tin or tin-silver alloy.

Figure 21:
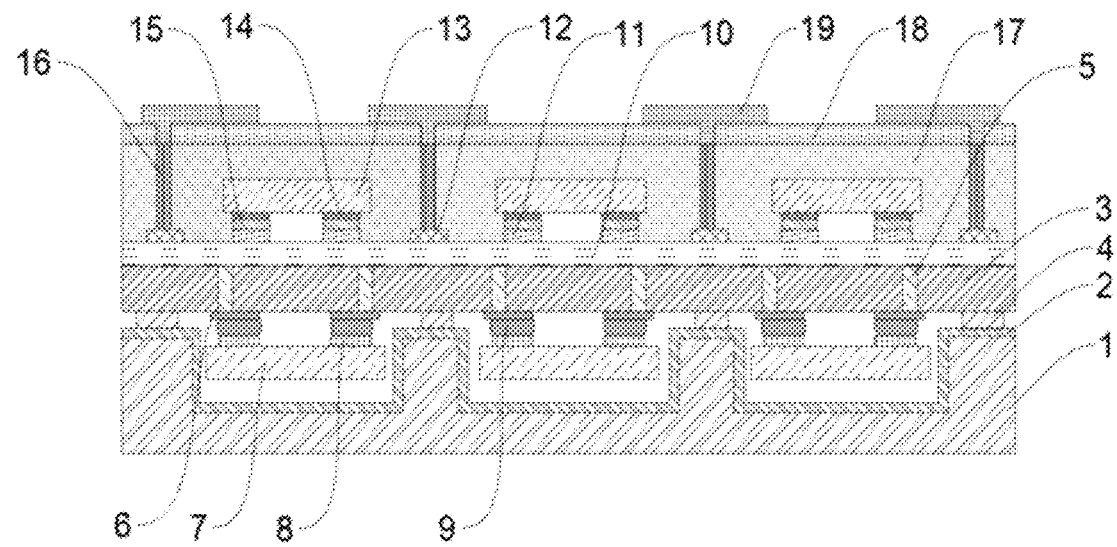
FIG. 21 is a schematic diagram of a first package structure to be processed according to an embodiment of the present disclosure.
Figure 22:
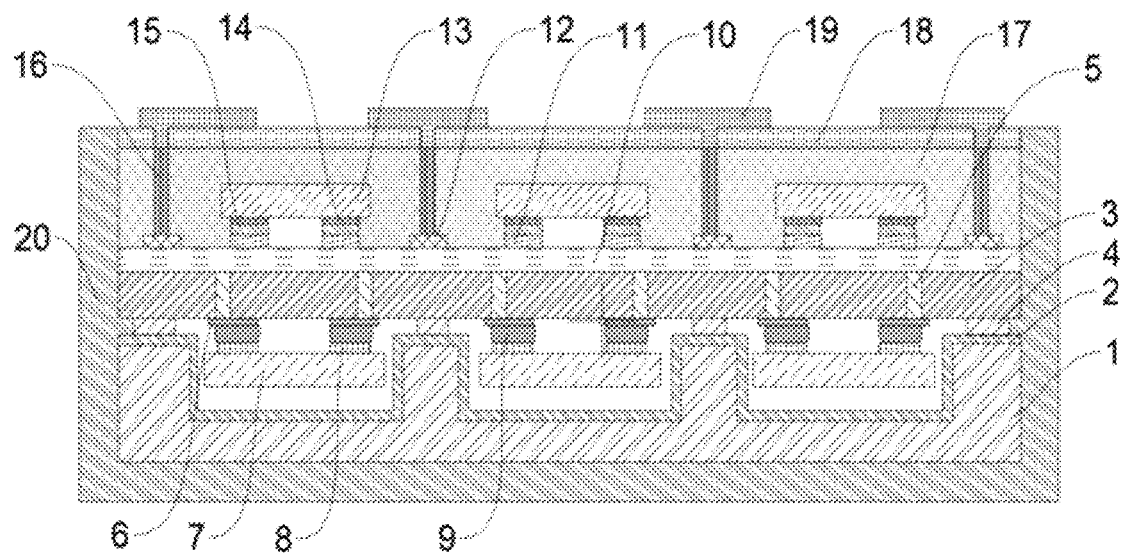
FIG. 22 is a schematic diagram of a third package structure to be processed according to an embodiment of the present disclosure.

Optionally, after obtaining the second radio frequency front-end module package structure, the method further includes thinning the side of the cover body to be bonded away from the second groove to obtain the first package structure to be processed. The first package structure to be processed is cut into first filter pieces. The first filter pieces are rearranged to obtain a second package structure to be processed. Plastic molding that second package structure to be processed to obtain a third package structure to be processed. And cutting the third package structure to be processed into second filter pieces. With reference to FIG. 21, the side of the cover plate 1 to be packaged of the cover body to be bonded away from the second groove is thinned. Referring to FIG. 22, the second package structure to be processed is molded to form a second plastic molding layer 20. The second plastic molding layer wraps the radio frequency front-end module to be bonded and the cover body to be bonded, and exposes one side of the radio frequency front-end module to be bonded where the first metal pad is arranged. In this way, the package structure of the second radio frequency front-end module is thinned, cut, rearranged and re-molded. It is convenient for users to select the required radio frequency components and radio frequency front-end components, so as to form the required package structure.

The disclosed embodiment provides a package structure of a radio frequency front-end module, which is manufactured by executing the above-mentioned packaging method for the radio frequency front-end module.

By adopting the package structure of the radio frequency front-end module provided by the embodiment of the present disclosure, a plurality of second grooves are formed in the preset cover plate to be packaged. A first metal layer is arranged at a side of the cover plate to be packaged with the second groove to form the cover body to be bonded. The preset radio frequency front-end module to be bonded is bonded with the cover body to be bonded. In this way, the first metal layer is disposed on the second groove. The manufacture of the electromagnetic shielding structure can be completed in the process of packaging the radio frequency front-end module to be bonded. There is no need to make a metal layer on the outer surface of the packaged radio frequency module chip particles one by one as the electromagnetic shielding structure, which can improve the efficiency of making the electromagnetic shielding structure.

Optionally, the radio frequency front-end module to be bonded includes a radio frequency front-end module to be bonded and a cover body to be bonded. The radio frequency front-end module to be bonded includes an interposer, a second metal layer, a first metal column, a fourth metal pad and a radio frequency front-end component. The interposer is provided with a second metal layer and a plurality of first grooves, each first groove is filled with a first metal column, each first metal column is connected with each fourth metal pad, each fourth metal pad is connected with the radio frequency front-end component, and the second metal layer is not in contact with each fourth metal pad. The cover body to be bonded includes a cover plate to be packaged and a first metal layer. The cover plate to be packaged is provided with a plurality of second grooves, and the side of the cover plate to be bonded with the second grooves is provided with a first metal layer. The first metal layer is connected with the second metal layer, each radio frequency front-end component is respectively arranged in each second groove, and each radio frequency front-end component, the first metal layer on the second groove corresponding to each radio frequency front-end component, the second metal layer and the interposer are together enclosed to form a cavity.

Optionally, the radio frequency front-end module package structure further includes an electrical interconnection layer provided with a second metal pad. The electrical interconnection layer is arranged at a side of the radio frequency front-end module to be bonded away from the cover body to be bonded. The first metal pad is electrically interconnected with the first metal column through the second metal pad.

Optionally, the electrical interconnection layer is also provided with a third metal pad, and the second radio frequency front-end module package structure also includes radio frequency module components, which are soldered on the electrical interconnection layer through the third metal pad. In this way, the package size of the radio frequency front-end module package structure is smaller by attaching the radio frequency components on both sides of the interposer.

Optionally, the second metal pads are respectively provided with second metal columns; the radio frequency front-end module package structure further includes a first plastic molding layer, which is arranged at a side of the electrical interconnection layer away from the radio frequency front-end module to be bonded. The first plastic molding layer wraps the second metal pad, the second metal column, the third metal pad and the radio frequency module component. The side of the first plastic molding layer away from the electrical interconnection layer exposes the second metal column. The first metal pad is electrically interconnected with the first metal column through the second metal column.

Optionally, the package structure of the radio frequency front-end module further includes a passivation layer, which is arranged at a side of the first plastic molding layer away from the electrical interconnection layer. The side of the passivation layer away from the first plastic molding layer exposes each second metal column. The first metal pad is electrically interconnected with the first metal column through the second metal column.

Figure 20:
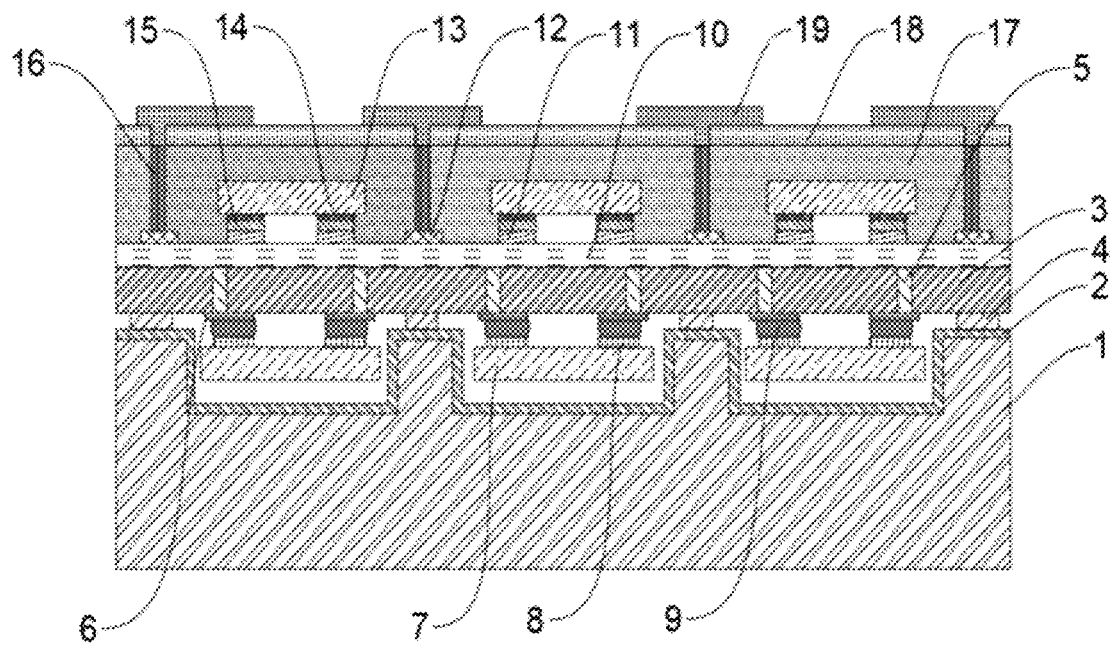
FIG. 20 is a schematic diagram of a structure after forming a first metal pad according to an embodiment of the present disclosure.

As illustrated by FIG. 20, the package structure of radio frequency front-end module includes: the radio frequency front-end module to be bonded and the cover body to be bonded. The radio frequency front-end module to be bonded includes an interposer 3, a second metal layer 4, a first metal column 5, a fourth metal pad 6 and a radio frequency front-end components. The interposer 3 is provided with the second metal layer 4 and a plurality of first grooves, each first groove is filled with a first metal column 5, each first metal column 5 is connected with a fourth metal pad 6, and the fourth metal pad 6 is connected with the radio frequency front-end component. The second metal layer is not in contact with each fourth metal pad. The cover body to be bonded includes a cover plate 1 to be packaged and a first metal layer 2. The cover plate 1 to be packaged is provided with a plurality of second grooves, and the side of the cover plate 1 to be packaged with the second grooves is provided with the first metal layer 2. The first metal layer 2 is connected with the second metal layer 4. Each radio frequency front-end component is respectively arranged in each second groove, and each radio frequency front-end component, the first metal layer on the second groove corresponding to each radio frequency front-end component, the second metal layer and the interposer are together enclosed to form a cavity. The electrical interconnection layer 10 is arranged at a side of the radio frequency front-end module to be bonded away from the cover body to be bonded. The electrical interconnection layer 10 is provided with a second metal pad 12 and a third metal pad 11. A second metal column 16 is formed on the second metal pad 12; the radio frequency module component is electrically connected to the third metal pad 11. The radio frequency module component includes a second component 13, a sixth metal pad 14 and a second tin solder ball 15. The second component 13 is provided with a sixth metal pad 14, and the sixth metal pad 14 is connected to the third metal pad 11 through a second tin solder ball 15. A first plastic molding layer 17 is formed at a side of the electrical interconnection layer 10 away from the radio frequency front-end module to be bonded. The first plastic molding layer 17 wraps the second metal pads 12, the second metal columns 16 arranged on the second metal pads 12, the third metal pads 11 and the radio frequency module components arranged on the third metal pads 11. The side of the first plastic sealing layer 17 away from the electrical interconnection layer exposes the second metal columns 16. A passivation layer 18 is provided at a side of the first plastic molding layer 17 away from the electrical interconnection layer 10. The side of the passivation layer 18 away from the first plastic molding layer 17 exposes each second metal column 16. The first metal pads 19 are connected to the exposed second metal columns 16.

The following points need to be explained:

(1) In the drawings of the embodiments of the present disclosure, only the structures related to the embodiments of the present disclosure are involved, and other structures can refer to the general design.

(2) The features of the same embodiment and different embodiments of the present disclosure can be combined with each other without conflict.

The above are only the specific embodiments of this disclosure, but the scope of protection of this disclosure is not limited to this. Any person skilled in the art can easily think of changes or substitutions within the technical scope disclosed in this disclosure, which should be covered by the scope of protection of this disclosure. Therefore, the scope of protection of this disclosure should be based on the scope of protection of the claims.

The invention claimed is:

1. A radio frequency front-end module, comprising:
   a first functional substrate, comprising a first base substrate and a metal bonding structure;
   a second functional substrate, comprising a second base substrate, a groove in the second base substrate, and a bonding metal layer;
   a first radio frequency front-end component, at least partially located in the groove; and
   a plastic molding structure,
   wherein the first base substrate and the second base substrate are oppositely arranged, and a surface of the second base substrate close to the first base substrate comprises a groove surface inside the groove and a substrate surface outside the groove,
   the first radio frequency front-end component is not in contact with the bonding metal layer, and the bonding metal layer comprises a first metal portion located on the groove surface and a second metal portion located on the substrate surface, the first radio frequency front-end component is at least partially surrounded by the first metal portion, and the second metal portion is bonded with the metal bonding structure, and
   the plastic molding structure wraps a surface of the second functional substrate away from the first functional substrate, a surface of the first functional substrate away from the second functional substrate, a lateral surface of the second functional substrate, and a lateral surface of the first functional substrate.

2. The radio frequency front-end module according to claim 1, wherein the first metal portion and the second metal portion of the bonding metal layer are integrally formed, and the groove surface comprises a first surface located at a bottom of the groove and a second surface located at a sidewall of the groove, and the first metal portion is continuously arranged on the first surface and the second surface.

3. The radio frequency front-end module according to claim 1, wherein the first functional substrate further comprises a substrate through hole penetrating the first base substrate and a first conductive structure located in the substrate through hole,
   the first radio frequency front-end component is electrically connected with one end of the first conductive structure, and the first radio frequency front-end component is spaced from the bonding metal layer,
   the first functional substrate further comprises:
   a flip-chip pad, connected with the first conductive structure,
   wherein the first radio frequency front-end component is soldered on the flip-chip pad, and the flip-chip pad is arranged in the same layer as the metal bonding structure.

4. The radio frequency front-end module according to claim 1, wherein the radio frequency front-end module comprises a plurality of first radio frequency front-end components, and the second base substrate comprises a plurality of grooves; the plurality of first radio frequency front-end components and the plurality of grooves are arranged in one-to-one correspondence, and each of the plurality of first radio frequency front-end components is at least partially located in a corresponding one of the plurality of grooves.

5. The radio frequency front-end module according to claim 1, wherein the first radio frequency front-end module comprises at least one selected from the group consisting of a filter die, a radio frequency switch chip, a radio frequency switch die, a low noise amplifier chip, a low noise amplifier die, a radio frequency power amplifier chip, a radio frequency power amplifier die, an inductor and a capacitor.

6. The radio frequency front-end module according to claim 1, further comprising:
   an electrical interconnection structure, located at a side of the first functional substrate away from the second functional substrate; and
   an array pad, located at a side of the electrical interconnection structure away from the first functional substrate.

7. The radio frequency front-end module according to claim 1, further comprising:
   an electrical interconnection structure, located at a side of the first functional substrate away from the second functional substrate;
   a metal pad, located at a side of the electrical interconnection structure away from the first functional substrate;
   a conductive support column, located at a side of the metal pad away from the electrical interconnection structure;
   a passivation layer, located at a side of the conductive support column away from the first functional substrate; and
   an array pad, located at a side of the passivation layer away from the plastic molding structure,
   wherein the plastic molding structure further comprises an upper molding portion located on the first functional substrate away from the second functional substrate, the upper molding portion comprises a first through hole, the conductive support column is located in the first through hole, the passivation layer comprises a second through hole, and the array pad is connected with the metal pad through the second through hole and the conductive support column located in the first through hole.

8. A communication device, comprising the radio frequency front-end module according to claim 1.

9. A radio frequency front-end module, comprising:
   a first functional substrate, comprising a first base substrate and a metal bonding structure;
   a second functional substrate, comprising a second base substrate, a groove in the second base substrate, and a bonding metal layer;
   a first radio frequency front-end component, at least partially located in the groove;
   an electrical interconnection structure, located at a side of the first functional substrate away from the second functional substrate;
   a first pad, located at a side of the electrical interconnection structure away from the first functional substrate;
   a second radio frequency front-end component, connected with the first pad;

a second pad, located at a side of the electrical interconnection structure away from the first functional substrate;
an encapsulation layer, located at a side of the second radio frequency front-end component away from the first functional substrate and wraps the second radio frequency front-end component;
a second conductive structure; and
an array pad, located at a side of the encapsulation layer away from the second radio frequency front-end component,
wherein the first base substrate and the second base substrate are oppositely arranged, and a surface of the second base substrate close to the first base substrate comprises a groove surface inside the groove and a substrate surface outside the groove,
the first radio frequency front-end component is not in contact with the bonding metal layer, and the bonding metal layer comprises a first metal portion located on the groove surface and a second metal portion located on the substrate surface, the first radio frequency front-end component is at least partially surrounded by the first metal portion, and the second metal portion is bonded with the metal bonding structure, and
the encapsulation layer comprises an encapsulation layer through hole, the second conductive structure is located in the encapsulation layer through hole, one end of the second conductive structure is connected with the second pad, and the other end of the second conductive structure is electrically connected with the array pad.

10. A radio frequency front-end module, comprising:
a first functional substrate, comprising a first base substrate and a metal bonding structure;
a second functional substrate, comprising a second base substrate, a groove in the second base substrate, and a bonding metal layer;
a first radio frequency front-end component, at least partially located in the groove; and
a plastic molding structure,
wherein the first base substrate and the second base substrate are oppositely arranged, and a surface of the second base substrate close to the first base substrate comprises a groove surface inside the groove and a substrate surface outside the groove,
the first radio frequency front-end component is not in contact with the bonding metal layer, and the bonding metal layer comprises a first metal portion located on the groove surface and a second metal portion located on the substrate surface, the first radio frequency front-end component is at least partially surrounded by the first metal portion, and the second metal portion is bonded with the metal bonding structure, and
the plastic molding structure wraps a surface of the second functional substrate away from the first functional substrate, a lateral surface of the second functional substrate and a lateral surface of the first functional substrate.

* * * * *